(12) United States Patent
Kleinhuber

(10) Patent No.: US 6,934,014 B1
(45) Date of Patent: Aug. 23, 2005

(54) DEVICE WITH AT LEAST ONE LIGHT SOURCE, COMPRISING SEVERAL INDIVIDUAL LIGHT SOURCES

(75) Inventor: Harald G. Kleinhuber, St. Jeannet (FR)

(73) Assignee: MYOS My Optical System GmbH, (DE)

( * ) Notice: Subject to any disclaimer, the term of this patent is extended or adjusted under 35 U.S.C. 154(b) by 260 days.

(21) Appl. No.: 10/110,585

(22) PCT Filed: Oct. 4, 2000

(86) PCT No.: PCT/EP00/09683

§ 371 (c)(1),
(2), (4) Date: Sep. 16, 2002

(87) PCT Pub. No.: WO01/26859

PCT Pub. Date: Apr. 19, 2001

(30) Foreign Application Priority Data

Oct. 13, 1999 (DE) ................................ 199 49 198

(51) Int. Cl.$^7$ ...................... B23K 26/06; G02B 27/14; G01B 11/00
(52) U.S. Cl. ...................... 356/72; 356/614; 250/201.3; 250/205; 219/121.74; 219/121.83; 359/859
(58) Field of Search ............. 356/72, 614; 219/121.73, 219/121.74, 121.75, 121.83; 359/850, 857, 359/858, 859; 250/201.2, 205

(56) References Cited

U.S. PATENT DOCUMENTS 4,826,269 A  5/1989  Streifer et al. ............. 350/3.72

(Continued)

FOREIGN PATENT DOCUMENTS

DE  197 25 262  12/1995

(Continued)

Primary Examiner—F. L. Evans
(74) Attorney, Agent, or Firm—Factor & Lake

(57) ABSTRACT

A device with at least one light source, comprising several individual light sources (3, 3') and an optical arrangement. At least two individual light sources (3, 3') comprise a light-emitting surface with different, long axes perpendicular to each other. At least two individual light sources (3, 3') form at least one individual light source grouping (4, 4'), which is arranged coaxially to the optical axis (5) of an astigmatic optical element (7). Said astigmatic optical element (7) is impinged upon by the emitted bundles (2) from the individual light sources. One axis of the emission surface of an individual light source (3) lies on the meridional plane of the astigmatic optical element (7). Said plane is defined through the mid-point of the emission surface. The other axis of the emission surface lies on the corresponding sagittal plane. The astigmatic optical element (7) has different imaging characteristics on the respective meridional and saggital planes for each light source (3), whereby each emitted bundle (2), in the light path to the astigmatic optical element (7), comprises a cross-sectional area with essentially equally long axes, on at least one compensation plane (13) which is perpendicular to the optical axis of the astigmatic optical element (7). All emitted bundles (2) are guided by bundle-guiding components (7, 11, 12, 7') on to a working plane (13), which is either formed by the compensation plane, or an optical plane which is common to all beams. A working beam of high intensity is thus generated by superimposition of the emitted bundles.

65 Claims, 13 Drawing Sheets

U.S. PATENT DOCUMENTS

| | | | |
|---|---|---|---|
| 4,828,357 A | 5/1989 | Arata et al. | 350/174 |
| 5,449,882 A | 9/1995 | Black et al. | 219/121.83 |
| 5,760,872 A | 6/1998 | Reis et al. | 351/205 |
| 5,862,278 A | 1/1999 | Brauch et al. | 385/34 |

FOREIGN PATENT DOCUMENTS

| | | |
|---|---|---|
| DE | 195 14 626 | 10/1996 |
| DE | 195 37 265 | 2/1997 |
| EP | 0 570 152 | 11/1993 |
| JP | 63-40694 | 2/1988 |
| WO | WO 99/64912 | 12/1999 |

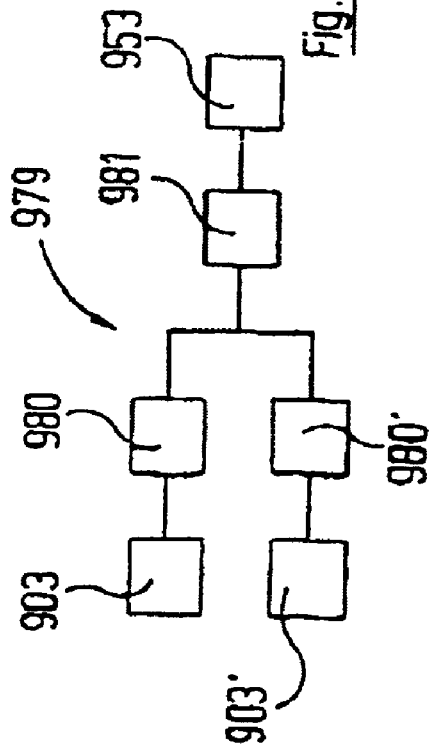
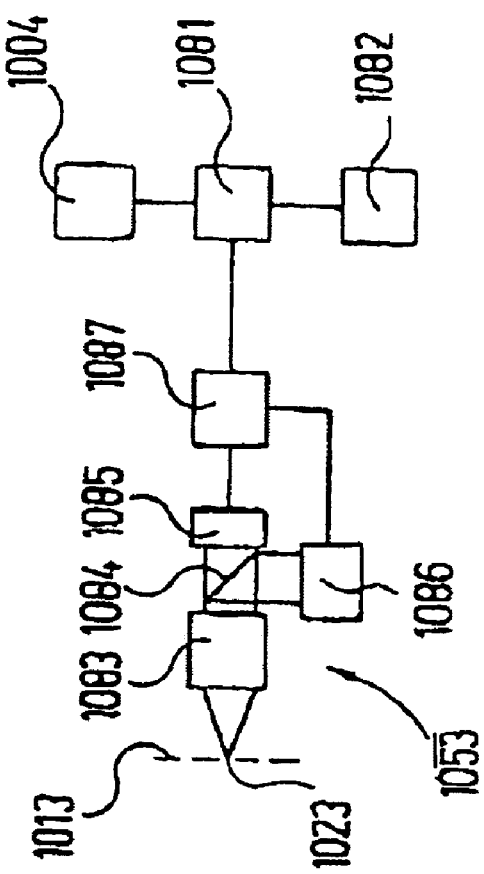

DEVICE WITH AT LEAST ONE LIGHT SOURCE, COMPRISING SEVERAL INDIVIDUAL LIGHT SOURCES

The invention relates to an apparatus having at least one light source which has or have a number of individual light sources, which has an optical arrangement, which, by superimposition, produces a focused working beam with a high area coverage from the emitted beams from the individual light sources, with at least two individual light sources having an emission area with axes which are of different length and are at right angles to one another.

Apparatuses such as these are used where the light from a number of individual light sources is intended to be superimposed, for example to increase the power in a relatively small physical working region. Applications such as these occur in material processing for example, for laser welding, cutting or drilling, as well as in the field of telecommunications, when a data transmission channel which is formed by an optical fiber is intended to be used for a high light power level for information transmission over long distances without intermediate boosters.

Individual light sources used in known apparatuses of this type are laser diode arrays, which are also referred to as bars. A laser diode array such as this has a large number of individual laser diodes arranged in a row. A high-power laser diode array has an output light power of approximately 50 W. Typical emission areas of such laser diode arrays have a longitudinal side (long axis) of typically 10 mm, and a narrow side (short axis) of typically less than 1 mm, for example 0.6 mm, or even 0.02 mm. In this case, the beam divergence of the light emitted from the laser diode arrays is typically greater by a factor of 3 in the planes parallel to the short axis of the emission area, than in the planes at right angles to the short axis.

It is known for laser diode arrays such as these to be stacked on top of one another in so-called stacks. The emission beams from the individual emission areas of the laser diode arrays within the stack are superimposed, in order to make use of the light power from the entire stack. In this case, it is known for each individual emitter within the laser diode arrays that are stacked in the stack to have an associated microlens, which collimates the emitted beam from an individual emitter, and thus allows imaging of an individual emitter on the input end of an optical fiber associated with it. In this way, a large number of fibers, which can be guided in a fiber bundle, are associated with a laser diode array, or else a stack. The output end of the fiber bundle can then be imaged by producing a focused working laser beam.

The handling of such a microlens array is relatively complicated, since the microlenses must be positioned close to the individual emitters, and the adjustment is accordingly critical. In addition, when using microlenses in conjunction with high-power laser diode arrays, the production and the choice of materials are highly critical, since very small absorptions at the emission wavelength of the laser diodes lead to intolerable heating of the microlenses.

It is also known for the emitted beams from laser diode arrays at different emission wavelengths to be superimposed using dichroitic input mirrors. This results in the disadvantage that only laser diodes at different wavelengths can be superimposed in this way.

The object of the present invention is thus to develop an apparatus of the type mentioned initially such that efficient superimposition of the individual light sources is made possible, with a compact optical arrangement whose losses are as low as possible and which involves little adjustment effort.

According to the invention, this object is achieved by an apparatus having the features specified in the specification, drawings and claims appended hereto.

The coaxial arrangement of the individual light source group allows a number of individual light sources to be accommodated in a relatively compact manner around the astigmatic optical element. Any supply and/or cooling lines which may be required can easily be routed at a distance from the beam path, namely on the side of the apparatus facing away from the optical axis.

The astigmatism of the astigmatic optical element ensures that the imaging characteristics of the optical arrangement can be matched to the focused beam parameters, which differ on the two main axes, that is to say to the beam cross section and the divergence, of the individual light sources. A main plane of the astigmatic optical element is in this case associated with a respective axis of the emission area of one individual light source. The astigmatic optical element moves the emitted beam from the individual light sources to a plane in which the cross-sectional area of the emitted beams has the same dimensions in two mutually perpendicular directions. The expression "axes of equal length" is used in the following text to identify this situation. This plane, referred to as the compensating plane, may either at the same time represent the working plane, or may be mapped onto such a working plane. In this way, the focused beams which leave the emission areas of the individual light sources with axes of different dimensions are formed into individual light source focused beams having a cross-sectional area with identical axes, which are superimposed on the working plane.

The focused working beam which is produced by superimposition can then be used, for example, for material processing or else for a telecommunications application. The "material processing" field of use is in this case not restricted to manufacturing technology, but also includes, for example, medical technology.

The optical apparatus may be formed using components which guide beams highly efficiently, so that virtually no losses occur in the beam guidance process.

According to the present invention, individual light sources constructed having individual emitters arranged alongside one another have emission areas with axes of different lengths, whose radiations can be superimposed in a simple manner using the astigmatic optical element to form a focused working beam.

The use of an individual emitters capable of emitting laser light according to the present invention allows focused working beams with optical characteristics which can be matched particularly well, and with the potential to produce very high power densities. Furthermore, with high-intensity laser light, known frequency conversion methods can be used to produce a spectral source in a desired spectral band.

One potential laser-emitter type includes laser diodes. Laser diodes are efficient lasers, large numbers of which can be accommodated in a relatively small area. This leads to the apparatus being compact.

In another preferred embodiment of the present invention, one or more of the individual emitters may be formed by the output fiber ends of a fiber bundle, preferably having a rectangular emission area, which is optically coupled to an emitted beam from a light source. The use of a fiber bundle as noted above also makes it possible to use the radiation from any desired other individual light source for the optical arrangement of the apparatus. The output beams from conventional optical fibers have beam parameters which are highly similar to those of laser diodes, so that it is possible to work with the imaging characteristics, which are in principle the same, of an astigmatic optical element.

In one preferred embodiment, where the individual emitter emits laser light, a solid-state laser. Such a solid state laser is preferably a compact laser with a high beam quality and power level.

The individual light sources of the invention can be arranged such that the emission areas form a polygon, which has a center axis that coincides with the optical axis of the astigmatic optical element. The arrangement of the individual light sources in such a manner leads to an essentially rotationally symmetrical apparatus, in which a number of individual light sources are integrated in a compact manner. The astigmatic imaging of the individual emission areas with axes of different lengths is in this case possible using a single astigmatic optical element.

In an alternative embodiment, the emitted beam powers from the individual light sources within an individual light source group and/or the individual light sources which are associated with different individual light source groups can be controlled jointly, and/or different light sources can be controlled individually, by a power control device. The use of a power control device allows the individual light sources to be switched on or off individually or in groups, so that it is possible to produce deliberate changes to the intensity distribution of the focused working beam, for example by controlling the laser diode currents by means of the power control device. Inhomogeneities in the power density distribution of the focused working beam can also be compensated for by appropriate actuation of the power control device.

In principle, the apparatus according to the invention allows individual light sources at one and the same wavelength to be superimposed. However, for certain applications, it may be advantageous to use individual light sources at different emission wavelengths. Applications such as these include wavelength-selective material layer deposition on a workpiece, which will be described in more detail further below, and the multiplexing of data transmission channels for telecommunications.

In one embodiment, the astigmatic optical element has an imaging surface that is an annular surface, which is concave when viewed from the outside. An astigmatic optical element formed in such a way can be reproduced cost-effectively, since the curvature in an imaging plane, namely the sagittal plane, is governed by the curvature of the annulus. It is thus possible to grind the imaging surface of the astigmatic element, for example using a spherical grinding tool passing over a circular track. There is no need for any angle adjustment of this optical element with respect to the individual light sources.

Alternatively, the imaging surface of the astigmatic optical element may be formed by facets that are fitted to it with multiple symmetry, coaxially with respect to the optical axis. Facetting of the astigmatic optical element allows the imaging surface to have a curvature which is independent of the annular shape of the astigmatic optical element. This leads to a greater bandwidth for those beam parameters which can be matched of the emitted beams from the individual light sources. For example, it is possible to manufacture an astigmatic optical element with concave curvature in both the meridional plane and in the sagittal plane. Any other desired combinations of concave or convex curvatures in the meridional and sagittal planes are possible.

The emitted beams of the invention may bound a central space, free of the emitted beams, and be superimposed from the individual light sources in the individual light source group. Preferably, a reflector is arranged in this central space, which is capable of reflecting back radiation which is reflected or re-emitted from a processing region located in the working place of a workpiece. The use of a reflector in the central space when the apparatus is used for material processing in which a large proportion of the focused working beam is reflected upwards from the workpiece leads to an increase in the radiation intensity in the working region. For example, at the start of a laser cutting or drilling process, the so-called pilot-drilling process, this leads to a short-term increase in the power density in the processing region.

In order to fully utilize the central space noted above, it may be beneficial to have at least one of the beam-guiding optical components with a central opening. Beam-guiding optical components with a central opening lead to the capability to use additional devices, which are themselves used for open-loop and closed-loop control processes and/or for material processing. An adjustment laser can also be passed through the central opening. When a number of light sources with associated optical arrangements are used coaxially, it is also feasible for the focused working beam from a first light source to be passed through the central opening in the optical components of an optical arrangement which is associated with a second light source, so that the focused working beam from a number of light sources can be superimposed.

In one possible embodiment, where there is a central space, a reflector in the central space, and a central opening in at least one beam-guiding optical component, the reflector may be arranged in the opening. The arrangement of the reflector in the opening leads to the reflector being accommodated in a compact manner.

In another embodiment of the present invention, the beam-guiding optical components are arranged such that the optical arrangement in the region about their optical axis has a continuous free space in which no radiation from the individual light source group is carried. The coaxial arrangement of the individual light source group results in the emitted beams from the individual light sources initially being emitted at a distance from the optical axis of the optical arrangement. If the entire beam path in the optical arrangement runs at a distance from the optical arrangement as far as the region where the emitted beams are superimposed to form the focused working beam, the optical components which guide the emitted beams from the individual light sources can also be cut out in the central region, thus providing the free space which can be used in various ways.

In a preferred embodiment, the invention includes a sensor arrangement for recording the processing region, which leads to the capability to monitor the processing region of the workpiece. Variables which can be used for such monitoring include, for example, the wavelength of the radiation reflected or re-emitted from the workpiece, the size of the processing region, that is to say the cross-sectional area of the focused working beam on the working plane.

The expression "reflected radiation" means that radiation which originates from the individual light sources and is returned directionally or diffusely from the workpiece surface. To a first approximation, the radiation which is not reflected from the workpiece is absorbed, heating the workpiece. The proportion of the reflected radiation may thus be a measure of the temperature of the workpiece, since this workpiece is heated in a defined manner by the absorbed radiation, as a function of its thermal conductivity and geometry. The isothermal lines around the processing region have a characteristic shape, whose position and development with time can generally be calculated in advance for processing activities which are not subject to any disturbance. The temperature measurement is carried out at different wavelengths than the emission wavelengths from the individual light sources and is used, for example, to detect a process disturbance or fault, with the temperature and its time profile being recorded using at least one temperature-measuring detector element on a selective basis in the processing region and/or around the processing region.

The expression "re-emitted radiation" means that radiation which originates from the workpiece and is stimulated by the light from the individual light sources that is absorbed by the workpiece. The wavelength of the re-emitted radiation may be used, for example, to determine the temperature of the processing region of the workpiece.

The reflected wavelength furthermore provides information about state parameters relating to the individual light sources, in the case of laser diodes as to whether they are being cooled sufficiently, since the emission wavelength depends on the temperature of the emitters.

The reflected or re-emitted total radiation intensity can also be used sensibly as a measurement variable for a sensor arrangement if, for example, the aim is to monitor the start or the end of a cutting process. At the start of a cutting process, the reflected radiation intensity is high, while it decreases suddenly at the end of the cutting process, that is to say when the focused working beam passes through the workpiece. The amount of reflected radiation can also be used to determine the penetration depth of the focused working beam, in a manner known per se.

The sensor arrangement described above may, in one embodiment, be arranged in the free space of the device. The arrangement of the sensor arrangement in the free space around the optical axis leads to the sensor arrangement being integrated in a compact manner in the apparatus.

The sensor arrangement may additionally be installed as part of the power control device. The measurement data which is obtained from the processing region using the sensor arrangement can then be used to calculate control signals in the power control device, which are passed on to the drivers of the individual light sources, thus allowing feedback control of the power levels of the individual light sources, for optimized process control.

Alternatively, the sensor arrangement can also include an optical sensor. The use of such an optical sensor leads to the capability to record measurement data at a high recording rate, and requires no contact.

A sensor arrangement may additionally include a wavelength-selective filter. The use of a sensor arrangement having such a filter widens the options for process control. For example, controlled material layer deposition is possible when the material layer to be deposited has reflection or re-emission characteristics which differ from those of the material layer located underneath. The wavelength-selective filter leads to the capability to use the sensor arrangement to distinguish between whether the detected radiation is still being produced from the material layer to be deposited or, since it is at a different wavelength, is being produced from the material layer located underneath. This information about the layer being processed at any given time can be used, for example, to actuate the power control device or a feed device for the workpiece.

Where the wavelength-selective filter is used, the emission wavelengths of two or more individual light sources having different emission wavelengths can be separated. Thus, individual light sources at different emission wavelengths can be monitored independently of one another using the sensor arrangement. When using individual light sources at, for example, two different emission wavelengths and with known output power levels, it is possible by measuring the light power reflected from the workpiece at these emission wavelengths and by forming the ratio of the two sensor arrangement signals associated with these light powers to carry out a spectral analysis of the processing region of the workpiece, based on its different absorption at the two emission wavelengths.

A sensor arrangement may additionally include an optical sensor that is position-sensitive, and include imaging optics for imaging the processing region to the optical sensor. Such an arrangement leads to the capability to monitor the shape and size of the processing region. In this case, the expression position-sensitive optical sensor means a sensor which responds to position changes of an object in the field of view of the sensor. A sensor such as this can be used, for example, to monitor the quality of the superimposition of the emitted beams from the individual light sources in the focused working beam.

A position-sensitive optical sensor may be a multiple detector sensor, a quadrant detector, a CCD detector, or a CMOS detector, amongst others. A multiple detector sensor is a sensor with adjacent light-sensitive regions which can be evaluated independently of one another.

A quadrant detector is a particularly cost-effective variant of a multiple detector sensor.

A CCD detector or a CMOS camera is a highly sensitive position-sensitive sensor. The expression "CCD detector" means any desired one-dimensional or two-dimensional CCD arrangement.

The sensor arrangement of the invention may additionally include an acoustic wave sensor. An acoustic wave sensor is a low-cost device. In many applications, particularly in the field of material processing, acoustic wave parameters vary in the various stages of material processing. If, for example, pulsed individual light sources with a specific repetition frequency are used, then sensitive measurements can be carried out at this frequency to determine whether the focused working beam is or is not impinging on a workpiece. In addition, in the case of workpieces which are formed from different material layers whose acoustic emission as a reaction to the impingement of the individual light sources is different, it is possible to use an acoustic wave sensor to control the material layer deposition.

In one embodiment, the sensor arrangement may be connected to an electronic evaluation device for signaling purposes, to determine the relative position between the working plane and the workpiece. An evaluation device allows the workpiece to be positioned optimally on the working plane. One known principle of operation for such an electronic evaluation device is the triangulation principle. If lateral determination of the relative position of the working region and the workpiece is also possible, it is possible to use the sensor arrangement and the evaluation device to provide a seam following device.

The emission areas of the individual light sources, the individual light source housings, the holding devices on which the individual light sources are mounted, and the beam-guiding optical components as well can be deformed by thermal or mechanical loads. In the worst case, this can reduce the quality of the imaging to an intolerable extent. One possible solution may be to include a compensating device for compensating for mechanically or thermally induced deformation of individual light sources in the individual light source group, of beam-guiding components, of holding bodies, or of heat sinks. The compensating device preferably includes actuators for controlled deformation or for the positioning of regions of the deformed portions/elements, such that the components which form the apparatus are deliberately deformed or positioned with respect to one another so as to compensate for thermal or mechanical effects that occur arbitrarily.

When a compensating device as described above is incorporated into the invention, it may be preferable to connect the actuators for signaling purposes via a control device to a detection device, which in turn has a sensor for recording the deformation. A sensor-coupled control device such as the one described allows automatic compensation for the thermally and/or mechanically induced deformation mentioned above.

The object of monitoring the thermal and/or mechanical deformation of components of the apparatus may be carried out in a simple manner by the sensor arrangement monitoring the processing region. Thermal and mechanical deformation leads to deformation of the focused working beam, which can be detected by the sensor arrangement, particularly if it has a position-sensitive sensor. The change in the parameters of the focused working beam which are detected in this way are used as actual values for controlling the compensating device.

As an alternative, the deformation of the components of the apparatus can be measured directly by position sensors. An optical interferometer, by way of example, may be used as such a position sensor.

The deliberate deformation of components of the apparatus may also be carried out hydraulically, by including actuators with a plurality of pressure chambers that are connected to a fluid reservoir via fluid channels. Preferably, the control device would be used in such an embodiment to individually control the respective fluid pressures in the pressure chambers. This makes it possible to achieve reproducible deformation, with high accuracy, in a relatively cost-effective way.

In a preferred embodiment, each pressure chamber has an associated closed fluid circuit, which has an inlet flow line from and an outlet flow line to a fluid reservoir, and in which a control valve is arranged which interacts with the control device. A hydraulic compensating device of such a structure has a simple design, and nevertheless works precisely.

If the closed fluid circuit disclosed above is utilized, it is possible to include that circuit as part of a cooling device for the optical arrangement. By doing so, an additional cooling function of the hydraulic compensating device is achieved.

A cooling device of the present invention may include heat sinks composed of highly thermally conductive material, in which the cooling fluid circulates, and which are thermally coupled to the individual light source or to the beam-guiding components. Such a structure leads to particularly good heat dissipation of the thermal energy produced during operation of the apparatus.

In one embodiment of the invention, the individual light sources in the individual light source group or the beam-guiding components are coupled via the heat sinks to holding devices composed of a material having a low thermal coefficient of expansion. By doing so, the thermally dependent deformation of the elements is reduced.

The heat sinks and/or the holding device may be manufactured from ceramic. The use of ceramic is advantageous for two reasons: ceramic has only a low thermal coefficient of expansion, and is at the same time highly thermally conductive.

In another embodiment, the apparatus includes a monitoring device for state parameters of the pressure and/or cooling fluid. A monitoring device makes it possible to control the operation of the compensating and/or cooling device well. The state parameters may be, for example, the temperature of the cooling fluid, the extent of ionization, the cooling fluid flow rate, and the temperature difference between the inlet and the outlet of the coolant, as well as the coolant pressure.

The actuators of the apparatus may be formed from piezoelectric elements, which are highly suitable for deformation compensation for components of the apparatus, since their effect is finely adjustable. In addition to pure compensation for thermal and mechanical deformation the piezoelectric elements can also be used for adjustment of the individual light sources and of the beam-guiding optical components, or for producing any desired structures of the focused working beam on the working plane, for example a line, a ring or rectangle. To this end, each individual light source or each beam-guiding component has associated piezoelectric elements, which allow adjustment within the required degrees of freedom.

The apparatus may additionally include an additional optical arrangement in the continuous free space that is capable of focusing an emitted beam from an additional light source that is not part of an individual light source group, with the working focus of the additional light source located on the working plane of the individual light source group. In the exemplary embodiment of the apparatus with the continuous free space, the additional light source can be integrated in a simple manner. Such an additional light source introduces a further working focus for material processing, in addition to the processing region of the individual light source group.

Particularly in the case of laser welding, such an apparatus allows working methods with two focal points which follow one another, in which case the beam parameters of the laser group and of the additional laser source can be set independently of one another. Particularly in the case of laser cutting, a refinement of the apparatus such as this allows working methods with two focal points located one above the other with respect to the optical axis, in which case the beam parameters of the individual light source group and of the additional light source can be set independently. This allows considerably improved cutting quality to be achieved.

The position and/or size of the working focus of the additional light source described above may be adjusted using adjustment optics, which are a part of the additional optical arrangement. The use of adjustment optics for the additional light source leads to the capability to adjust the working focus independently of the position of the processing region.

The adjustment optics may be formed by at least one lens or one objective, and may be arranged in a housing that can be adjusted via an adjustment device relative to the optical axis and relative to the processing region. The refinement of the adjustment optics ensures that the focal position and the size of the working focus can be adjusted easily.

As an alternative embodiment, the longitudinal axis of the housing of the adjustment optics, which coincides with the optical axis of the optics, is inclined with respect to the optical axis of those components of the optical arrangement that carry the emitted beams from the individual light sources in the individual light source group, with the adjustment device having a rotary drive for rotating the adjustment optics about the optical axis of the components of the optical arrangement. The refinement of an adjustment device in this manner allows the working focus to be rotated around the processing region.

In one embodiment, the adjustment device is connected for signaling purposes to a positioning controller for positioning the working focus with respect to the processing region. In combination with a position controller, the adjustment device allows automatic process control for material processing using two focal points, for example for a laser welding process. This control can be carried out either on the basis of stored CAD data, or via a seam following device.

The positioning controller may also be connected for signaling purposes to a monitoring device for determining position and/or processing parameters of the workpiece. Connecting the positioning controller to a monitoring device ensures control of the material processing process that is carried out with two focal points, for example by monitoring the positions and sizes of the working focus and of the processing region and, if required, also by determining the temperature at the working focus and/or in the processing region, or by monitoring further parameters. Fully automatic material processing is then possible in conjunction with the CAD data mentioned above and/or with an additional program controller.

When using two focal points during a processing activity it may be necessary to change the relative power densities at the working focus and in the working region for different workpiece materials or for workpieces composed of different material layers. One embodiment of this invention can accomplish this result by connecting the processing controller to the power control device for signaling purposes.

The additional light source used with the apparatus may, in one embodiment, be a solid state laser. The use of a solid state laser as the additional laser source leads to the capability to control the working focus well.

The apparatus may include a beam guidance system for guiding the additional light source with respect to the adjustment optics. Preferably, the beam guidance system is an optical fiber whose output end is firmly connected to the housing of the adjustment optics. In this case, a large-volume individual light source (for example a $CO_2$ laser or an optical system for frequency conversion) can be used as the additional light source, whose radiation is passed via the beam guidance system to the apparatus, so that the radiation power is available there, but the compactness of the apparatus is not adversely affected. In addition to an optical fiber, it is also possible, for example to use a telescopic arm as the radiation guidance system, along which arm the emitted beam from the additional light source is supplied to the apparatus.

A welding arrangement for arc welding may be at least partially arranged in the continuous free space, with a welding working region of the welding arrangement being located on the working plane of the individual light source group. Such an arrangement leads to the capability to combine two welding methods, for example a laser welding method and an arc welding method, to form a hybrid welding method. The combination of the two welding methods allows a high degree of flexibility for material processing.

The apparatus may additionally include a fluid feed apparatus that is connected to a fluid reservoir and which has a feed device which is at least partially arranged in the free space, with a free aperture, and which has a feed end for fluid, by means of which fluid can be applied to the processing region and/or fluid can be sucked out of the processing region. A fluid feed apparatus as described makes it possible to supply a cutting gas or a barrier gas to the processing region. In the former case, for example in the case of laser welding, liquid metal from the cutting region is forced out in order to increase the cutting efficiency. In an alternative embodiment, the fluid feed apparatus is in the form of a suction apparatus, by means of which smoke, for example, which is produced during the material processing and leads to contamination of the optical components or to an adverse effect on the processing efficiency of the apparatus by absorption, is sucked out.

The feed device described above may also include a feed tube in which the fluid is guided at least in places within the continuous free aperture region, and whose feed end is adjacent to the processing region. The feed tube in such an embodiment carries the fluid to a region close to the processing region. In the first embodiment, this makes the supply of fluid, and hence the forcing out of material, more efficient, and in the second embodiment makes the suction process more efficient.

The feed end of the feed device may be in the shape of a nozzle in one embodiment. The nozzle leads to fluid being applied deliberately to the processing region.

Since the feed end is adjacent to the processing region, it is generally subjected to an increased temperature and to workpiece material forced upwards from the processing region. Therefore, in one preferred embodiment the feed end is interchangeable or replaceable. The interchangeability or replaceability of the feed end means that the fluid feed apparatus can be maintained cost-effectively.

As already mentioned above, the fluid feed device operates more efficiently the closer the feed end is to the workpiece. In one embodiment of the apparatus, therefore, it is advantageous to include a distance measurement device for determining the distance between the feed end and the workpiece. A distance measurement device makes it possible to monitor that the feed end is in the optimum position.

In another embodiment, at least the feed end is composed of electrically conductive material and has a holder which electrically isolates the feed end from the workpiece, with the distance measurement device being a capacitance measurement arrangement for determining the capacitance between the feed end and the workpiece. The refinement of the distance measurement device is in this case particularly simple.

As a further embodiment, the feed tube may be composed of electrically conductive material and be surrounded, at least in places, by a shielding electrode. When using a shielding electrode, it is possible to predetermine the region of the workpiece which is used as the opposing electrode for the capacitive distance measurement. Since the surface of the processing region changes continuously as a consequence of the material processing, it may be expedient to enlarge the opposing electrode region on the workpiece by correspondingly reducing the shielding of the feed tube.

The apparatus may further include a device for producing an axial relative movement between the feed tube and the shielding electrode. Such an arrangement allows adjustment of the size of the opposing electrode to be controlled remotely and/or to be automated.

The shielding electrode may, in one embodiment, consist of a shielding tube that is coaxial with respect to the feed tube. This refinement of the shielding electrode is particularly simple.

The apparatus may also include a positioning device for producing a relative movement between the feed end and the workpiece. Including such a positioning device allows the positioning of the feed end to be remotely controlled or to be automated. If the positioning device is designed such that lateral adjustment of the feed end with respect to the workpiece is also possible, the feed end can be set centrally above the processing region.

Furthermore, the positioning device may also include an adjusting device for fine positioning of the feed end with respect to the workpiece. An adjusting device according to the above increases the accuracy of the positioning device.

The adjusting device may additionally include an adjusting light source that is fitted to the feed device, and whose radiation is guided such that it is collimated at least by the feed end of the feed device. An adjusting light source arranged according to the above is a particularly simple adjusting device. The light spot which emerges through the feed end and which is applied to the workpiece is in this case used to adjust the feed end in the lateral direction.

A laser diode which operates in the visible wavelength band is a particularly compact and cost-effective light source for this purpose.

If a gas is used as the fluid for the apparatus, this leads to excess material being forced efficiently out of the working region of the apparatus.

The apparatus may additionally include a number of individual light source groups, arranged coaxially with respect to the optical axis. The number of individual light source groups can be combined such that focused working beams overlap in a processing region. The coaxial arrangement can in this case be designed such that a number of individual light source groups are arranged at different radii from the central optical axis of the optical arrangement. Alternatively or additionally, the individual light source groups can also be arranged offset with respect to one another in the direction of the optical axis. Each individual light source group can have an associated optical arrangement for producing the respective focused working beam.

Exemplary embodiments of the invention will be explained in more detail in the following text with reference to the drawing, in which:

FIG. 13 shows a schematic block diagram of a power control circuit for two lasers;

FIG. 14 shows a schematic block diagram of a wavelength-selective material processing control circuit for the apparatus;

Figure 1:
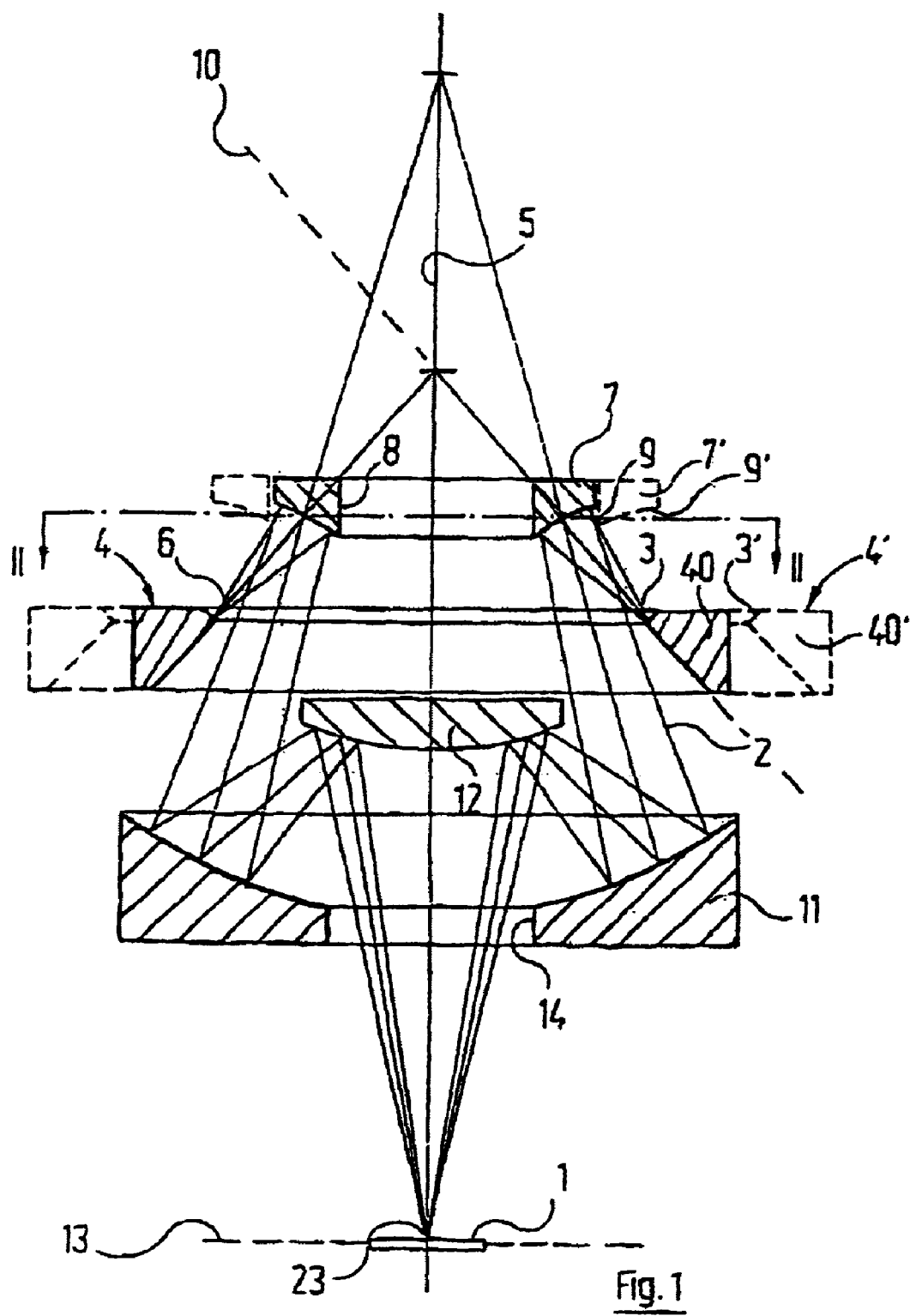
FIG. 1 shows a meridional section through a laser group and the optical components of an apparatus according to the invention, with the beam path of the emitted beams from two laser diode arrays in a laser group being illustrated schematically.

An apparatus having the beam path illustrated schematically in FIG. 1 is used for material processing of a workpiece 1, which is illustrated schematically in FIG. 1, with the assistance of laser light. Examples of such processing include welding, cutting, drilling, sputtering or surface treatments such as hardening.

Figure 2:
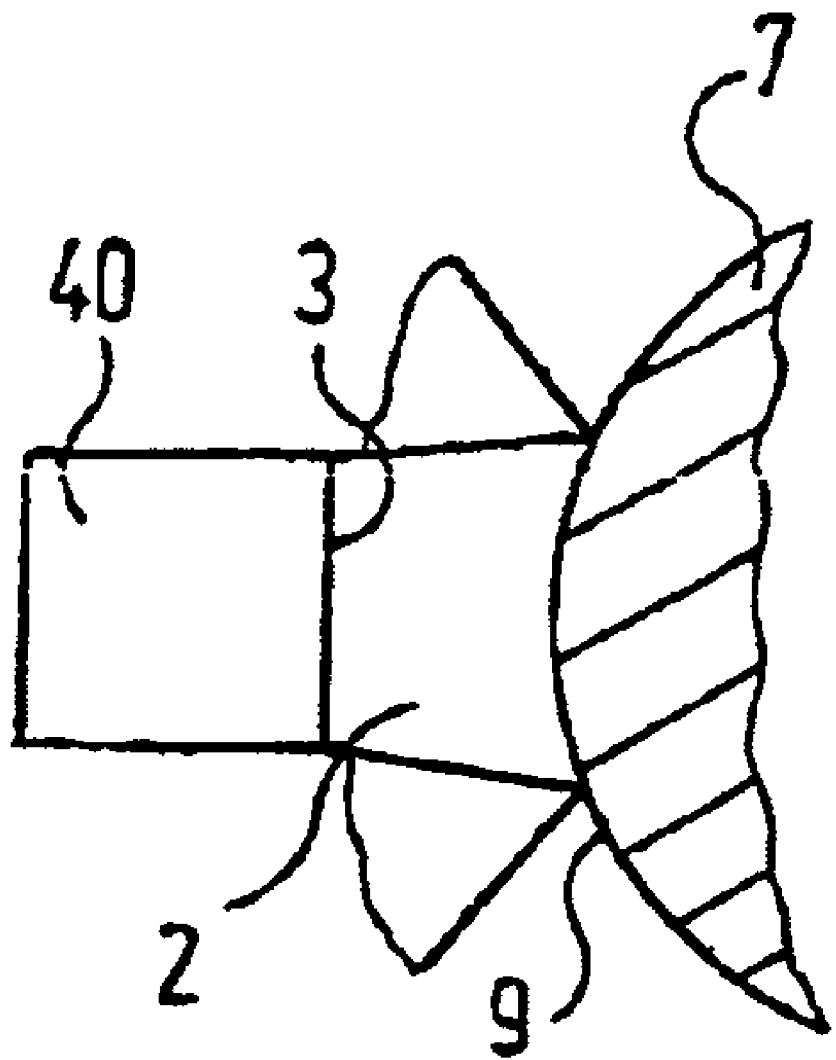
FIG. 2 shows a partial view of a section along the line II—II in FIG. 1.

The material processing lasers that are used are high-power laser sources which, in a typical apparatus, have a mean optical total output power of several hundred watts, which must be concentrated in a small-area working region on the workpiece 1. The optical arrangement illustrated in FIGS. 1 and 2 is used for superimposition of the emitted beams 2 for optical beam guidance of the emitted beams 2 from laser diode arrays 3 which, as will be described in the following text, form a laser group 4.

The laser diode arrays 3 in the laser group 4 are arranged coaxially around an optical axis 5 of the optical arrangement on an annular heat sink 40. In practice, this heat sink 40 is subdivided, for easier handling and to simplify the mounting of the laser diode arrays 3, into individual segments, which can each be fitted with a number of laser diode arrays 3, and can be dismantled individually. The thermal coefficient of expansion of its material matches that of the housing of the laser diode array 3.

FIG. 1 shows the laser diode arrays 3 schematically as a closed ring; the number of laser diode arrays 3 accommodated in this ring can be chosen depending on the requirements for the material processing apparatus. Typical numbers that are used are up to 30 laser diode arrays 3.

The emission areas of the laser diode arrays may be located on the side surfaces of a polygon; alternatively, a configuration is also possible in which the emission areas run in a curved shape around the optical axis 5 with a curvature which corresponds to the distance between the emission areas and the optical axis 5.

These emission areas (in this context, see also the emission areas 306 in FIG. 5) of the individual laser diode arrays 3 are rectangular, with a typical length ratio of the mutually perpendicular axes of approximately 10 mm to 0.6 mm. The long axis of the emission area lies on the sagittal plane which is associated with the meridional plane in FIG. 1 (see FIG. 2), and the short main axis is arranged on the meridional plane defined by the center point of the emission area (shown schematically as an emitter in the form of a point in the section in FIG. 1).

The emitted beam 2 emerges divergently from the emission area of a laser diode array 3, and is imaged by a reflective astigmatic optical element 7. The divergences of the emitted beam 2 with known laser diode arrays 3 are different parallel to the axes of the emission area: the divergence parallel to the short axis of the emission area is in this case more than three times as great as that parallel to the long axis.

The optical element 7 is annular with a central opening 8, which is coaxial with respect to the optical axis of the astigmatic optical element 7, which itself coincides with the optical axis 5 of the optical arrangement.

The astigmatic optical element 7 has an imaging area 9, with two different curvatures, for imaging of the emitted beam 2 from a laser diode array 3.

In the meridional plane associated with a laser diode array 3, that is to say the plane which is defined by the optical axis 5 and the center point of the emission area 6, the imaging area 9 has concave curvature, seen from the outside, and has a magnifying effect. In the corresponding sagittal plane which is associated with the emission area, that is to say in the plane which contains the center beam (which originates from the center point of the emission area) of the emitted beam 2 and is at right angles to the above-mentioned meridional plane, the imaging area 9 has convex curvature and has a reducing effect. The line of intersection between a sagittal plane associated with a laser diode array 3 and the corresponding meridional plane (coinciding with the plane of the drawing for this laser diode array) is represented by a dashed line in FIG. 1, and is annotated with the reference symbol 10.

The radius of curvature of the convex curvature of the imaging area 9 of the astigmatic optical element 7 in the sagittal planes associated with the laser diode arrays 3 is governed by the radius of the astigmatic optical element 7. This is matched to the concave curvature of the imaging area such that the virtual image of the emission area which is produced has approximately the same size in both mutually perpendicular axis directions.

The imaging area 9 produces a virtual image of the emission area of the laser diode array 3. In FIG. 1, the virtual image point is shown as the point of intersection S of the beams in the emitted beam 2, which is reflected from the imaging area 9 in the meridional plane which coincides with the plane of the drawing. This is produced if the beams of the emitted beam 2 as reflected from the imaging area 9 is imagined to be extended in the meridional plane through the astigmatic optical element 7 in the opposite direction to the beam direction. The beams then intersect at the virtual image point S on the optical axis 5.

The astigmatic optical element 7 also produces a virtual image of the emission area in the sagittal plane. However, owing to the astigmatic character of the optical element 7, the meridionally running edges of the emission area are not imaged in exactly the same focal plane in which the Sagitally running edges are imaged. A plane which runs between these two focal planes and forms a good compromise for the imaging of the edges is referred to as the "compensating plane" in the following text.

FIG. 1 shows how the emitted beams 2 (reflected by the astigmatic optical element 7) from the laser diode arrays 3 are passed on by a combination of a spherical concave mirror 11 and a spherical convex mirror 12. This combination images the compensating plane in a working plane 13, in which the workpiece 1 is arranged. The concave mirror 11 has a central opening 14, which runs coaxially with respect to the optical axis 5 and is aligned with the opening 8 in the astigmatic optical element 7. The emitted beams 2 from the laser diode arrays 3 run through the opening 14 such that they converge at a superimposition point, which will be described in more detail in the following text.

As indicated by dashed lines in FIG. 1, a further laser group 4' can be provided, which is arranged coaxially around the laser group 4 described above. In this case, a further astigmatic optical element 7', as well as further optical components if necessary (not shown) are provided for imaging the emission areas of the laser group 4'.

Further embodiments of material processing apparatuses are described in FIGS. 3, 4 and 6 to 16. Components which correspond to those in FIGS. 1 and 2 are annotated by reference symbols increased by 100, and will not be described in detail once again.

Figure 4:
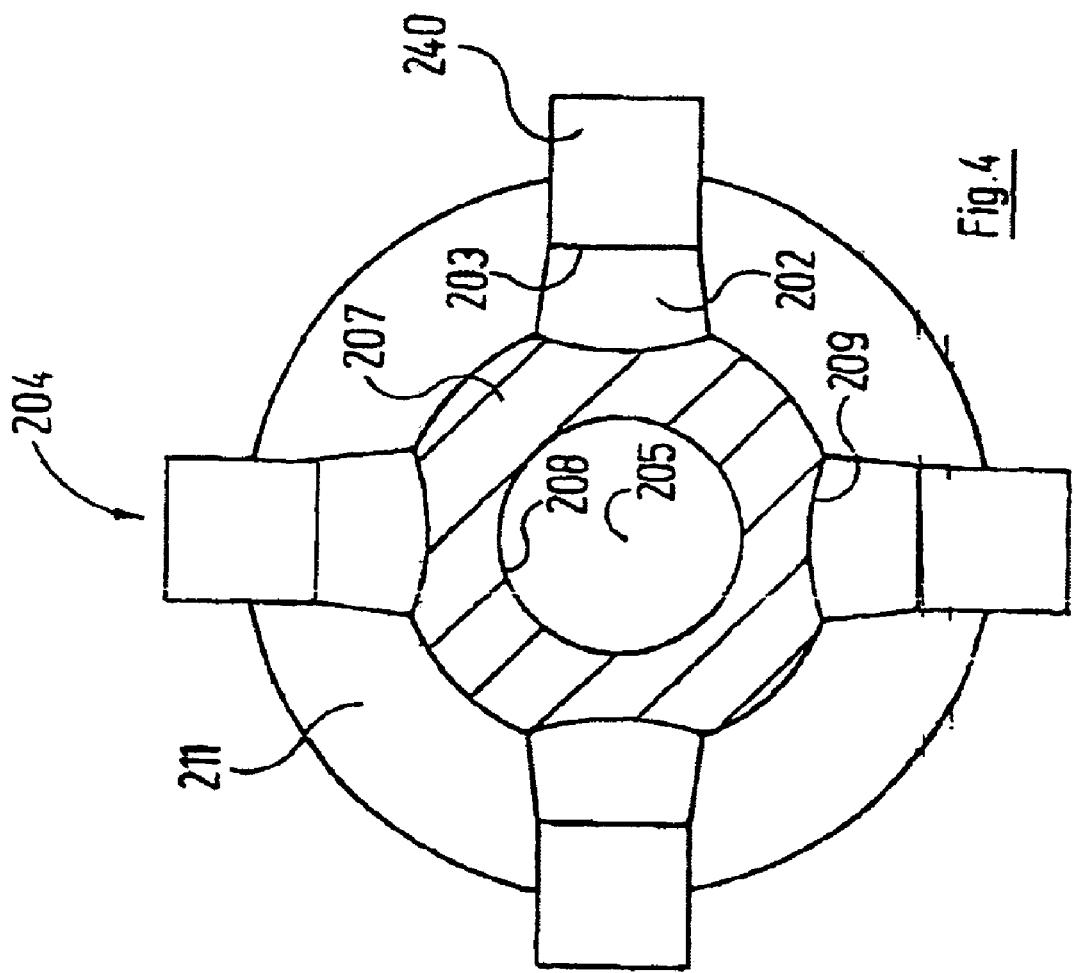
FIG. 4 shows a section, similar to that in FIG. 2, with a further alternative astigmatic optical element.
Figure 3:
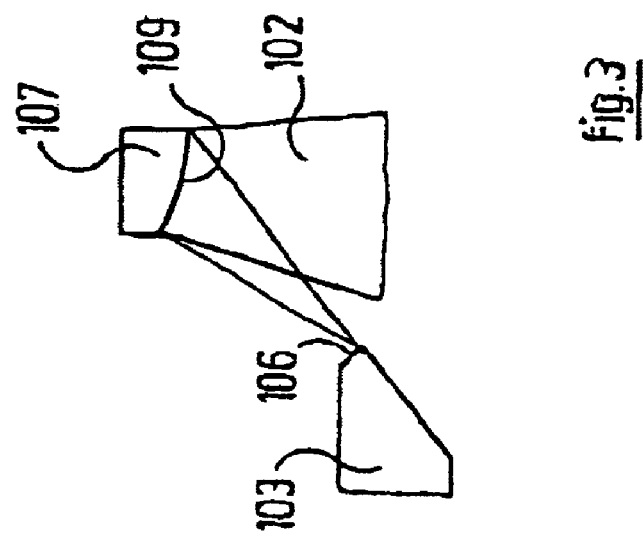
FIG. 3 shows a partial view of a section similar to that in FIG. 1, with an astigmatic optical element which is an alternative to that shown in FIGS. 1 and 2.

As is shown in FIGS. 3 and 4, the curvatures of the respective imaging areas 109 and 209 of the respective astigmatic optical elements 107 and 207 in the meridional and sagittal planes which are associated with the individual laser diode arrays 3, are also alternatively designed, in order to produce a compensating plane, such that the curvature in the meridional plane is convex (see FIG. 3), and such that the curvature in the sagittal plane is concave (see FIG. 4). In the first case, the emission area of the laser diode array 103 is reduced by different amounts, and in the second case it is increased by different amounts, in the two mutually perpendicular axis directions. In both cases, this results in a virtual image of the emission area or [sic] with approximately equal side lengths.

In order to provide concave curvature in the sagittal plane, the astigmatic optical element 207 has four imaging areas 209 in the form of facets, with one facet 209 in each case being associated with one laser diode array 3.

The choice of the radii of curvature of the imaging areas 9, 109 and 209, respectively, makes it possible to adjust the position of the compensating plane and the size of the cross-sectional area of the emitted beams 2, 102 and 202, respectively, in the compensating plane.

The curvatures of the imaging areas 9; 109; 209 do not need to be constant. Alternatively, the imaging area 9, 109, 209 may, for example, be curved parabolically or such that it follows a more complex function in order, for example, to compensate for imaging errors during the adjustment of the compensating plane. The optical components which follow the astigmatic optical element 7, 107, 207 may also have curvatures other than spherical curvatures, in a corresponding manner.

The described optical arrangement always makes use of reflective optical components. In an analogous manner, the optical arrangement can also be constructed using transmissive optical components, or else in the form of a catadioptric system. Holographic components may also be used for beam guidance.

Figure 5:
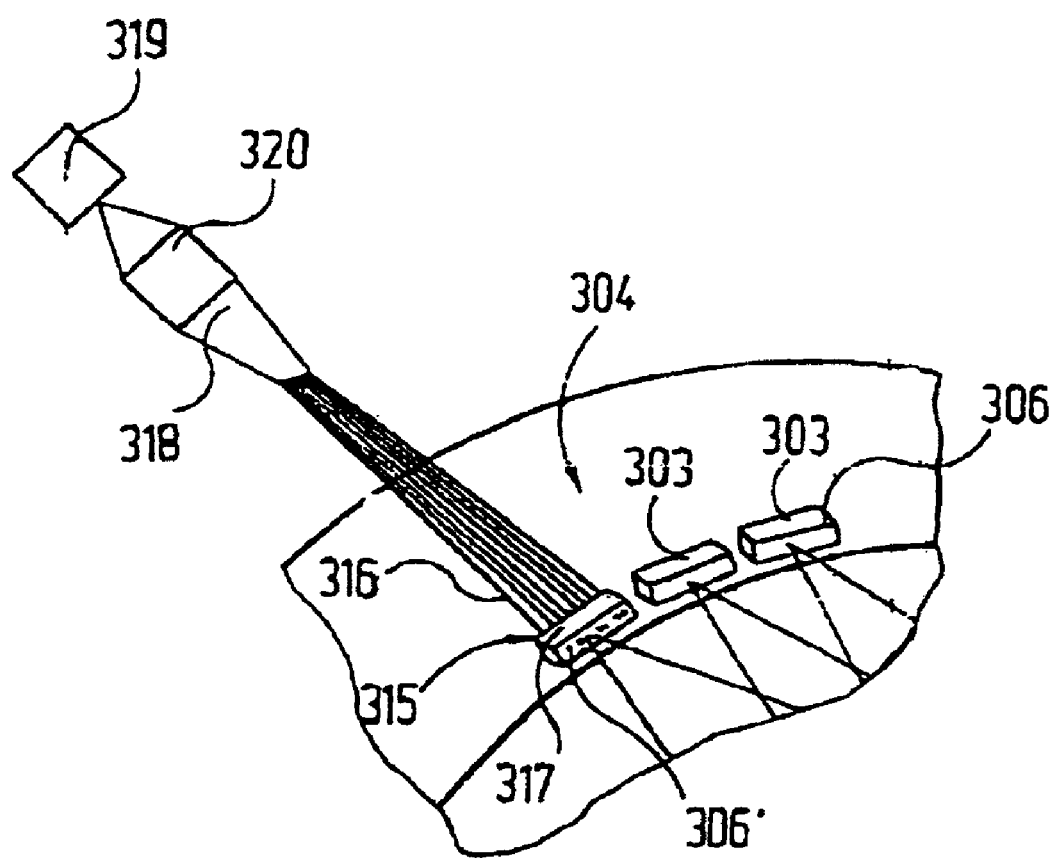
FIG. 5 shows, schematically, an arrangement of three laser diode arrays on a holding ring which is associated with a laser group.

As FIG. 5 shows, the emission areas 306 of the laser diode arrays 303 are formed from a large number of individual laser diodes, for example 1024 in practice, arranged alongside one another in a row. The emission from each laser diode in the laser diode arrays 303 is illustrated schematically in FIG. 5.

The laser diode arrays 303 each have an optical power of approximately 60 W, and produce a thermal power loss of the same magnitude. The laser diodes in commercially available laser diode arrays are arranged on a diode chip with a thickness of 0.1 to 0.2 mm. This chip is in turn arranged on the heat sink for dissipating the thermal energy which is produced during operation of the laser diode array 303. One possible design of such a heat sink is also described.

The laser type used for the material processing apparatus is not restricted to laser diode arrays. Fiber arrays can also be used instead of or together with laser diode arrays 303, for example the fiber array 315 shown in FIG. 5. This has a large number of fibers 316, whose output ends are mounted in a thermally conductive base 317 in such a way that they are located alongside one another in a row, and thus form an emission area 306'. The lengths of the axes of the latter correspond to those of the emission areas 306 of the laser diode arrays 303.

An emitted beam 318 from an Nd:YAG laser 319 is input, by means of input optics 320, into input fiber ends which form the opposite termination of the fibers 316 and are in the form of essentially rotationally symmetrical bundles. An individual emitted beam emerges from each of the output ends of the fibers 316, and its divergence is comparable to that of the emitted beam from a laser diode in the laser diode array 303.

The optical power of the fiber-coupled Nd:YAG laser 319, emerging from the emission area 306', is comparable to that from a laser diode array 303, that is to say in the region of 60 W.

As can be seen from the beam paths of the emitted beams 2 in FIG. 1, the central region of the convex mirror 12 is not used for imaging of the emitted beams 2. In the embodiment of the material processing apparatus illustrated in FIG. 6, a central opening 421 is formed in this unused central region of a convex mirror 412. A concave reflection mirror 422 is arranged in this central opening 421, and its radius of curvature corresponds to its distance from the working plane 413, on which the workpiece 401 is arranged. Light which is reflected in the direction of the reflection mirror 422 from a working region 423, that is to say from the region in the working plane 413, in which the superimposed emitted beams 402 from the laser diode arrays 403 impinge on the workpiece, is reflected back again into the working region 423, thus increasing the efficiency of the material processing apparatus, particularly at the start of a laser cutting process (pilot hole cutting).

Figure 6:
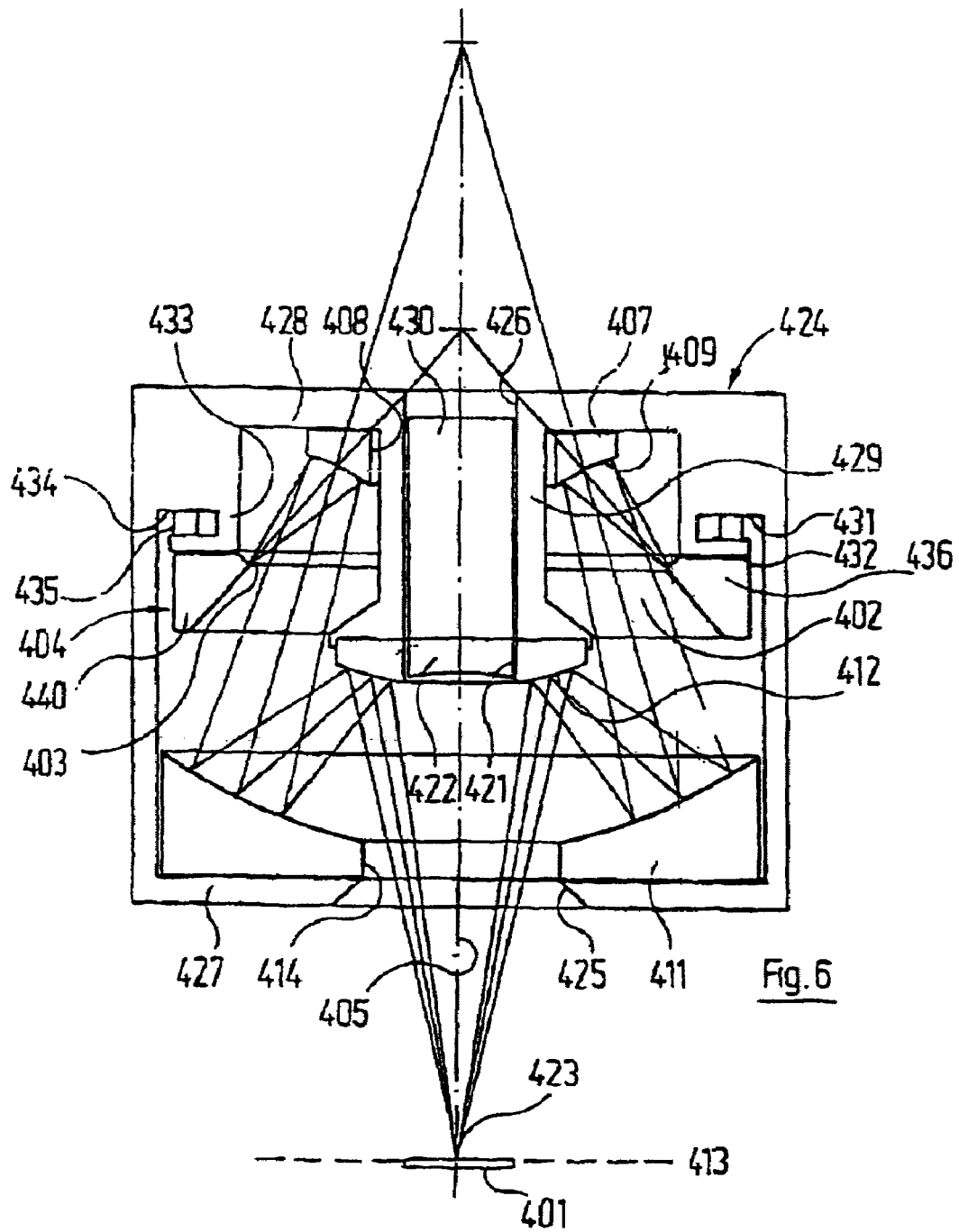
FIG. 6 shows an apparatus, as an alternative to FIG. 1, in a housing with an additional reflection mirror.

FIG. 6 shows the arrangement of the laser diode arrays 403 and of the optical arrangement of the material processing apparatus in a housing 424. The housing 424 is in the form of a hollow cylinder, with openings 425, 426 being formed in the two end walls. The opening 425 which faces the workpiece 401 is the opening for the emitted beams 402 to pass through, and is aligned with the central opening 414 in the concave mirror 411. The latter is fitted internally on the lower end wall 427 of the housing 424, surrounding the opening 425.

The opening 426 which is formed in the upper end wall 428 of the housing 424 continues in a sleeve 429 which projects into the interior of the housing 424. The internal diameter of the sleeve 429 corresponds to the opening 426; the sleeve 429 projects into the opening 421 in the annular convex mirror 412, which is inserted into a holder for one end of the sleeve 429, this being the end which is inside the housing, and which widens in a conical shape. The reflection mirror 422 forms the axial continuation of a holding shaft 430 of the same diameter, to which the reflection mirror 422 is connected. The holding shaft 430 lies snugly in the sleeve 429, so that the reflection mirror 422 can be adjusted axially by moving the holding shaft 430 in the sleeve 429, in order to adjust its distance from the working region 423.

The astigmatic optical element 407 is arranged coaxially with respect to the sleeve 429, and is connected to the upper end wall 428 of the housing 24 in the following manner.

Starting from the upper end wall 428 of the housing 424, that side wall 433 of the hollow-cylindrical housing 424 which forms the cylindrical casing initially runs as a relatively thick wall and then tapers via a step 431, after which it essentially has the same thickness as the lower end wall 427. A holding ring 432 is integrally formed on the radially inner end of the step 431, over a web 433, which is likewise annular. In this case, the web 433 extends towards the lower end wall 427, while the holding ring 432 which is integrally formed on it is bent through 90° and runs radially outwards, with a space remaining between the outside of the holding ring 432 and the side wall 433 of the housing 424. The holding ring 432 together with the step 431 thus bounds an annular groove 434, which runs horizontally in the housing 424 and opens radially outwards. A number of piezoelectric actuators 435 are arranged in this annular groove 434, such that they are supported between the holding ring 432 and the reinforced section of the side wall 433. Each laser diode array 403 has an associated piezoelectric actuator 435.

The annular heat sink 440, to which the laser diode arrays 403 are fitted, is mounted on a coupling surface 436 of the holding ring 432, facing the lower end wall 427.

For design reasons, different parts of the apparatus are generally combined to form functional units. Thus, for example, the sleeve 429 forms a unit with the convex mirror 412, or the heat sink 440 together with the holding ring 432 forms a unit with the astigmatic optical element 407.

Figure 7:
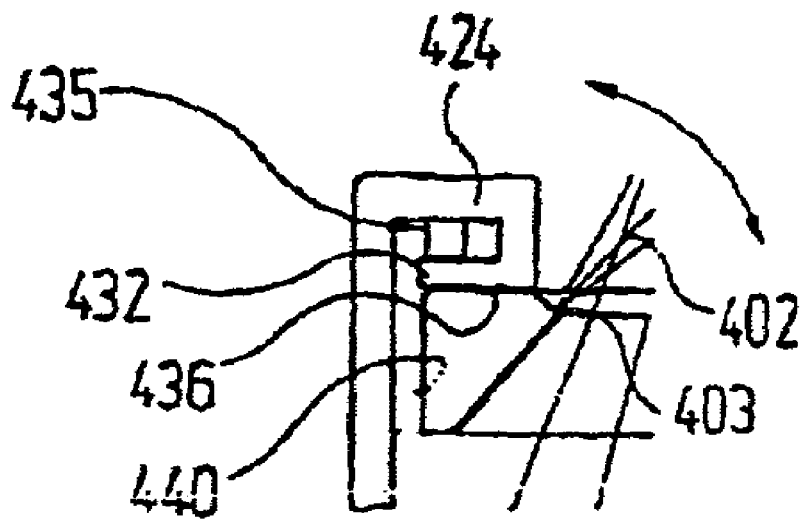
FIG. 7 shows an enlargement of a detail from FIG. 6, in the region of a laser diode array.

As can be seen from FIG. 7, changing the length of a piezoelectric actuator 435 in the direction parallel to the optical axis 405 (see FIG. 6) of the optical arrangement results in the holding ring 432 being tilted, and in resultant tilting of the laser diode array 403 associated with that piezoelectric actuator 435. This tilting results in corresponding tilting of the emitted beam 402 in the meridional plane shown in FIG. 7. This tilting produces a degree of freedom for the adjustment of the superimposition of the emitted beams 402 from the laser diode array 403 in the working region 423. Further piezoelectric actuators, with appropriately matched active directions, can be provided in order to set any further degrees of freedom which may be required.

Figure 8:
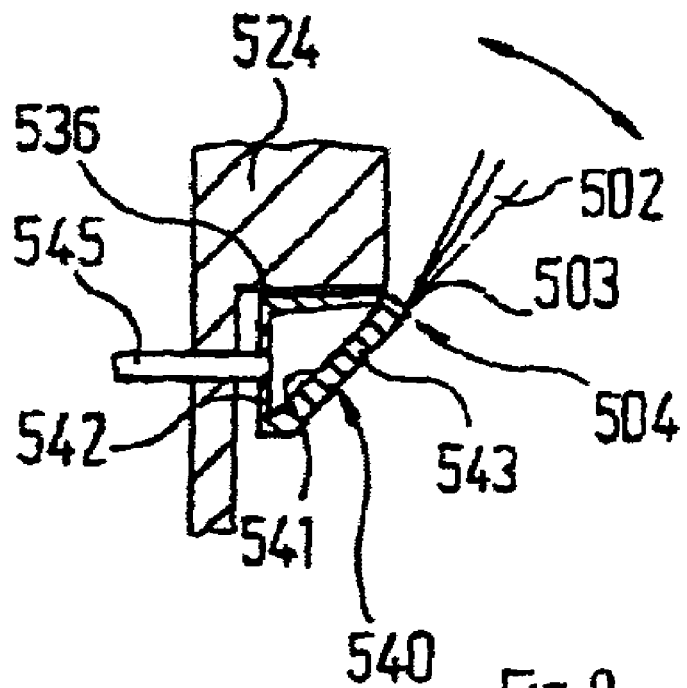
FIG. 8 shows an illustration, similar to FIG. 7, of an alternative embodiment of the holder and of the cooling of a laser diode array.
Figure 9:
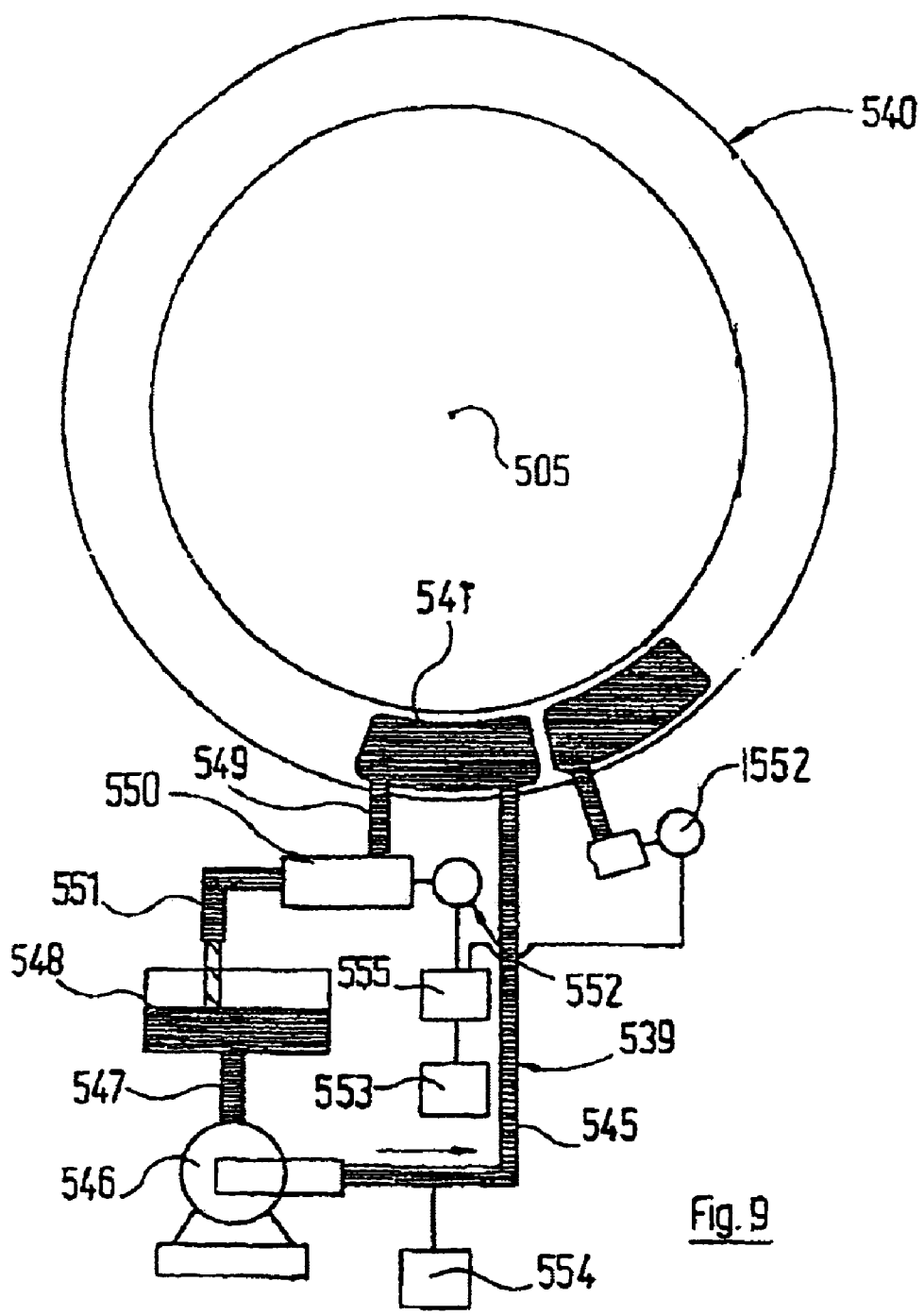
FIG. 9 shows, schematically, the components of a hydraulic device in conjunction with the embodiment shown in FIG. 8.

An alternative, hydraulic arrangement for adjusting laser diode arrays 503, by means of which these laser diode arrays 503 can be cooled at the same time, is shown in FIGS. 8 and 9. Heat sinks 540 for the laser diode arrays 503 in this case contain chambers 541, which are part of a cooling circuit 539 associated with each laser diode array 503. This is shown completely in FIG. 10 for one laser diode array 503, and is shown partially for a further laser diode array 503.

The chamber walls of the chamber 541 (which has an essentially triangular cross section in FIG. 9) in the heat sink 540 have a wall thickness such that any change in the cooling water pressure in the chamber 541 leads to tilting of the emission area of the laser diode array 503, which is analogous to that tilting which is produced by the piezoelectric actuators 435 in the exemplary embodiment shown in FIG. 8.

The outer casing wall 542 (on the annulus side) of the housing ring 540 is designed to be thin in the region of the chambers 541, such that any increase in the cooling water pressure in the chambers 541 results in the casing wall 542 expanding in a direction parallel to the optical axis of the optical arrangement, which coincides with the center axis of the heat sink 540. The conically running casing wall 543, which obliquely faces the optical axis of the optical arrangement, is in contrast designed to be sufficiently thick that any increase in the pressure in the chamber 541 does not lead to any significant expansion of the casing wall 543.

The emission area of the laser diode array 503 may be regarded as an end-face termination of the casing wall 543. A defined tilting movement of the emission area, which results from the different expansion behavior of the casing walls 542, 543, is ensured by designing the casing wall 544, which is connected to the coupling surface 536 of the housing 524 and forms the third boundary face of the triangular cross-sectional area of the chamber 541 in FIG. 9, to be wedge-shaped. The region where the casing wall 544 is thinnest is in this case directly adjacent to the emission area. This region where the wall is thinnest thus produces a hinge for the tilting of the emission area as a result of a change in the cooling water pressure in the chambers 541.

The cooling water is supplied to the chambers 541 via a respective inlet flow line 545, by means of a hydraulic pump 546 (see FIG. 9). The hydraulic pump 546 is connected to a cooling water reservoir 548 via a further line 547.

An outlet flow line 549 passes from the chamber 541 via a proportioning valve 550 and via a further line 551 back to the cooling water reservoir 548. The cooling water pressure in the chamber 541 can be adjusted by means of the opening width of the proportioning valve 550. The proportioning valve 550 is actuated by a valve control circuit 552 for this purpose. This actuation is dependent on the signal from a deformation detection circuit 555, which will be described in the following text and is connected, for signaling purposes, to the valve control circuit 552.

The chambers 541 are manufactured for a predetermined nominal internal pressure during the production of the housing ring 540, such that the laser diode array 503 can be adjusted by tilting the emission areas as a function of the chamber pressure, within a wide cooling water pressure range.

The range of the actuated internal pressure in the chambers 541 is, for example, between 5 and 15 bar.

A cooling water monitoring device 554 is connected to the cooling water circuit 539, and monitors the cooling water temperature, the cooling water flow rate, the ionization level of the cooling water and, via corresponding temperature sensors (not shown), the temperature difference between the coolant inlet and outlet. Cooling parameters, for example cooling power or the level of contamination of the cooling water, can be determined from this data. When critical cooling parameters occur, the monitoring device causes the laser diode arrays 503 to be deactivated, and emits an alarm signal.

The cooling water body 540 is made of copper. Alternatively, it can also be made of some other material which results in a thermal conductivity factor that is greater than 160 W/mk. For example, the cooling water body 540 can be manufactured from highly thermally conductive ceramic with a low coefficient of thermal expansion. In the region of the coupling surface 536, the housing 524 of the optical arrangement is manufactured from a material which has high thermal conductivity and has the same coefficient of thermal expansion as the material of the cooling water body 540.

Figure 10:
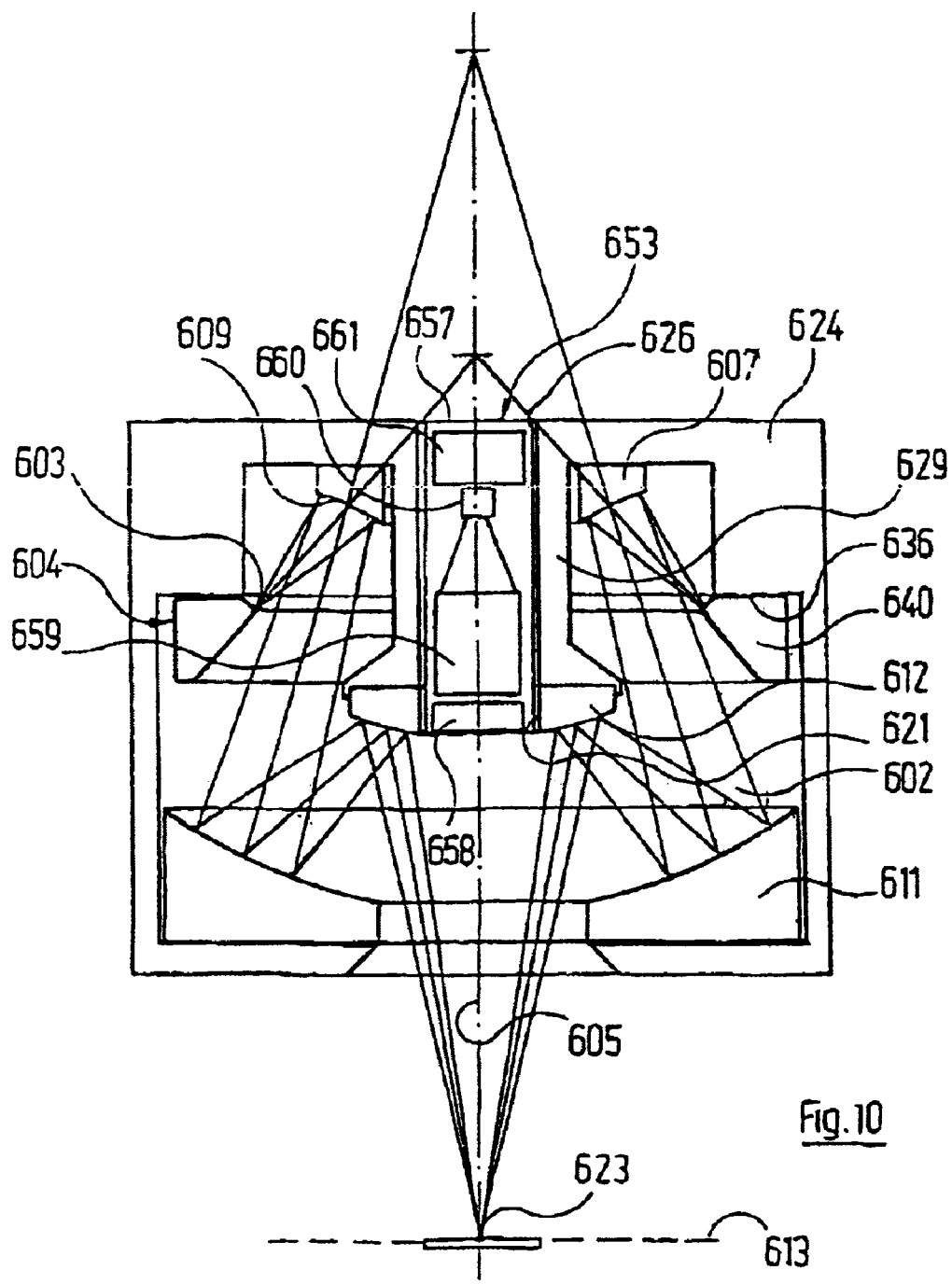
FIG. 10 shows an alternative apparatus to that in FIG. 6, with a sensor arrangement.

In addition to adjustment of a laser diode array 503 for adjustment of the optical arrangement, the chamber pressure control process described in FIGS. 9 and 10 is also used to provide overall compensation for mechanical or thermal deformation of the cooling water body 540.

Mechanical deformation of the cooling water body 540 can occur by virtue of its own weight or by stresses which occur during assembly or as a consequence of transportation of the material processing apparatus. Thermal deformation occurs, for example, as a result of heat being emitted in a manner which is not rotationally symmetrical from the laser diode arrays 503 to the cooling water body 540.

In order to compensate for such deformation, a computer in the deformation detection circuit 555 processes the data from a position-sensitive sensor 553, which corresponds to sensors which will be described in the following text, and accordingly passes on signals to the individual valve control circuits 552 for the cooling water circuits 539 associated with the laser diode arrays 503. The deformation of the cooling water body 540 resulting from a change to the pressures applied to the individual chambers 541 leads to corresponding repositioning of the individual emission areas of the laser group 504 overall and, via the imaging characteristics of the optical arrangement, to a corresponding change to the shape of the processing region. This shape change is in turn monitored by the sensor arrangement 553.

In the described exemplary embodiment, each chamber 541 has an associated laser diode array 503. However, the number of chambers 541 may also be very much greater, thus allowing correspondingly greater accuracy for the deformation compensation process.

Figure 11:
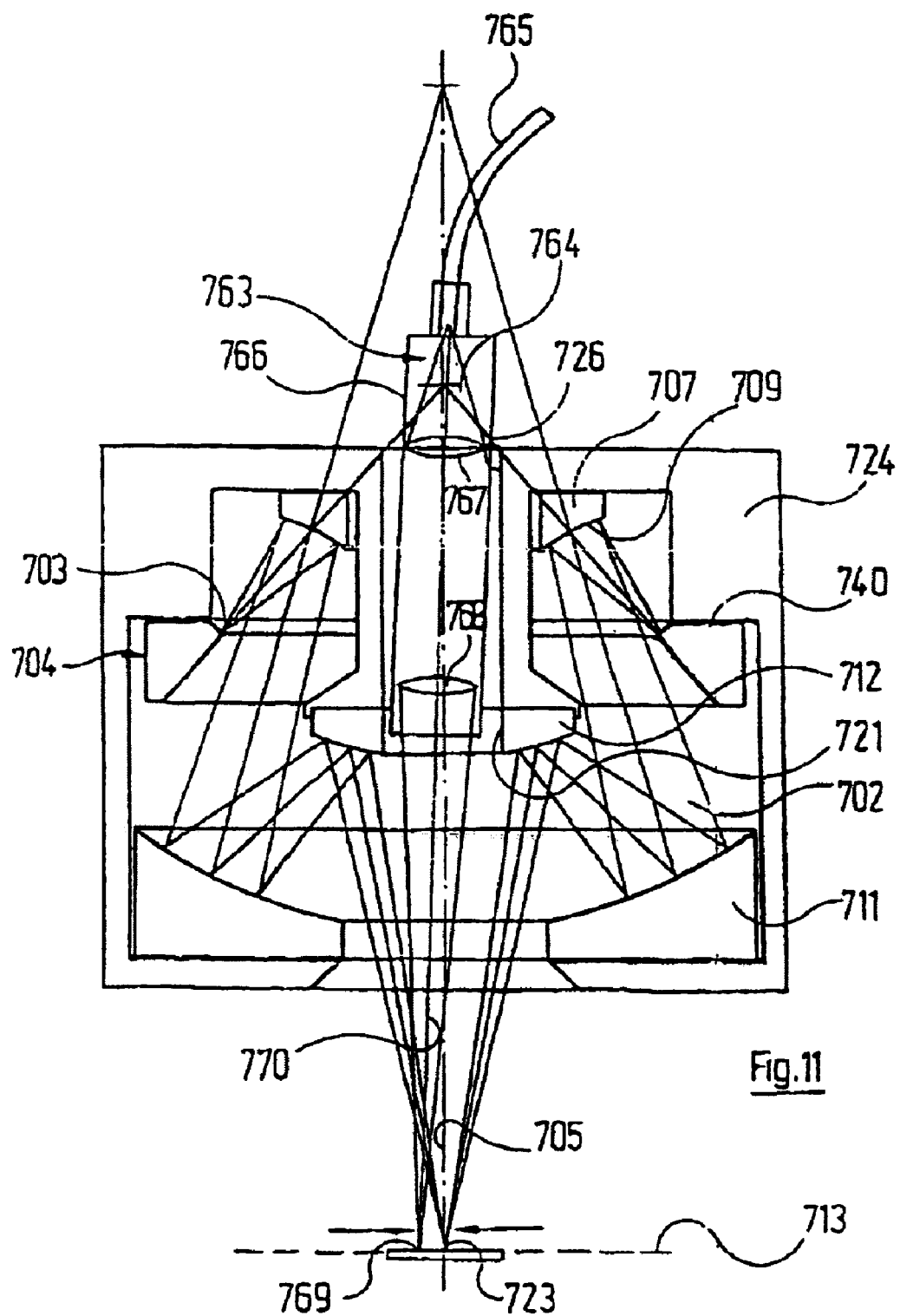
FIG. 11 shows a further alternative apparatus with guide components for the emitted beam from an additional laser, which is not part of the laser group.
Figure 12:
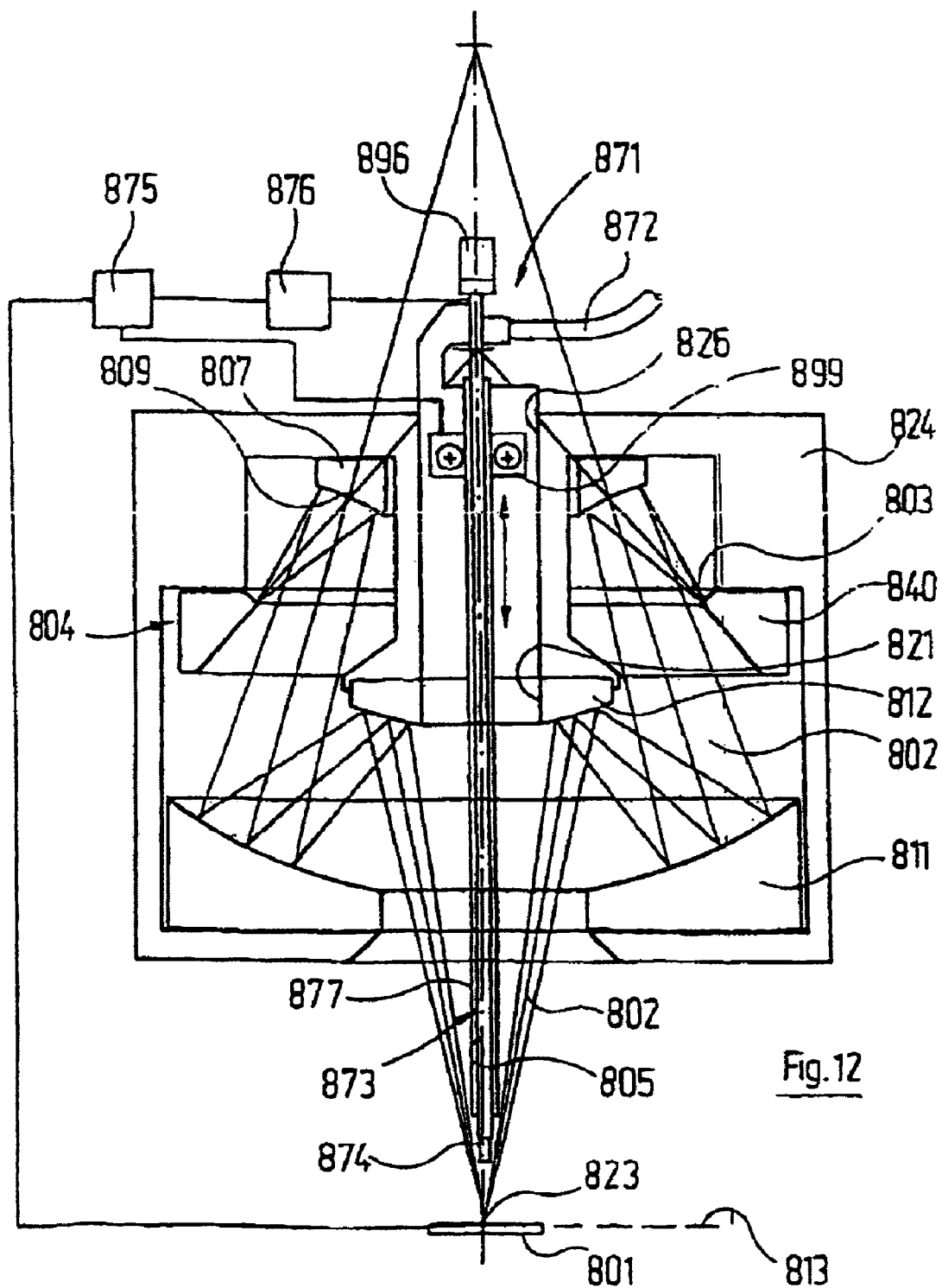
FIG. 12 shows an alternative apparatus with a cutting gas supply apparatus.

The embodiment in FIG. 10 shows an example of a sensor arrangement 653 which can interact with the deformation control process described above. The optical arrangement of the material processing apparatus in FIG. 11 is accommodated in a housing 624, which is essentially physically identical to the housing 424 which has been described in conjunction with FIG. 6. The only difference in this case is that the holder for the laser diode arrays 603 is formed simply by connecting the heat sink 640 to a coupling surface 636 which is formed by a housing step, in an analogous manner to that which has been described in conjunction with FIG. 8. There is thus no need for any holding ring corresponding to the holding ring 432, or for piezoelectric actuators.

A housing 657 for the sensor arrangement 653 is inserted into the mutually aligned central openings 621, 626 in the convex mirror 612 and in the sleeve 629. The housing 657 is open towards the processing region 623. A wavelength-selective filter 658 is first of all arranged in the housing 657, adjacent to the processing region 623 from which radiation is reflected or re-emitted in the direction of the sensor arrangement 653. Radiation originating from the processing region 623 in the direction of the sensor arrangement 653 is first of all filtered by the filter 658, and may be attenuated by an additional neutral glass filter, independently of the wavelength. The filtered light is then imaged by imaging optics 659 onto a two-dimensional CCD array 660. The imaging optics 659 may be a single lens, or else a preferably achromatic objective. The image of the processing region 623 as detected by the CCD array is read to a memory (not illustrated) for an electronic evaluation device 661, which is connected to the CCD array.

A sensor arrangement 653 such as this makes it possible to monitor the processing parameters for material processing. For example, the wavelength of the light emitted from the processing region 623 can be used to determine the temperature of the processing region 623. In addition, the extent of the processing region 623 monitored by the sensor arrangement 653 provides information about the imaging quality of the optical arrangement, with the capability to correct this by means of an appropriate device, for example as described above.

The wavelength-selective filter 658 can be used, for example, to filter out wavelengths which interfere with the detection process. Alternatively or additionally, the filter 658 also makes it possible to select a wavelength band which is imaged selectively onto the CCD array 660. This allows the three-dimensional temperature distribution in the processing region 623 to be described.

If edge filters are used for the wavelength-selective filter 658, additional applications are possible for the sensor arrangement 653, and these will be described later.

In the embodiment of the material processing apparatus illustrated in FIG. 11, the housing 724 is designed to be physically identical to that shown in FIG. 10. Adjustment optics 763 for guiding an emitted beam 764 from an Nd:YAG additional laser, which is independent of the laser group 704, are arranged in the openings 721, 726. The radiation emitted from the additional laser, which is not illustrated, is coupled into an optical fiber 765. That end of the fiber 665 [sic] which faces the housing 724 is mounted on a housing 766 for the adjustment optics 763. The emitted beam 764 which emerges from the fiber end into the housing 766 is collimated by a first lens 767, and is focused by means of a second lens 768 to form a working focus 769 of the additional laser, which is located on the working plane 713, but is at a lateral distance away from the working region 723.

The longitudinal axis of the housing 766, which coincides with the optical axis 770 of the adjustment optics 763, is inclined with respect to the optical axis 705 of the optical arrangement for imaging the emitted beams 702 from the laser diode arrays 703. A rotary drive (not illustrated) which acts on the housing 766 allows the adjustment optics 763 to be rotated about the optical axis 705, that is to say about a conical envelope surface. Such rotation leads to corresponding movement of the working focus 769 (which is located on the optical axis 770 of the adjustment optics 763) on a circular arc about the processing region 723, which is located on the optical axis 705 of the optical arrangement for imaging of the emitted beams 702.

A further adjustment apparatus, which is not illustrated, also allows the inclination angle of the longitudinal axis of the housing 766 to be adjusted with respect to the optical axis of the optical arrangement for imaging of the emitted beam 702, and hence allows the distance between the working focus 769 of the additional laser and the processing region 723 to be adjusted.

The embodiment of a material processing apparatus illustrated in FIG. 12 once again shows an optical arrangement for imaging of the emission areas of laser diode arrays 803 onto a processing region 823 in a housing, which is physically identical to those housings in the embodiments described in conjunction with FIGS. 10 and 11. A cutting gas supply apparatus 871 is arranged in the openings 821, 826 and in the space which is adjacent to these openings 821, 826 in the direction of the processing region 823 and is free of emitted beams 802. This cutting gas supply apparatus 871 has a cutting gas supply line 872, in which cutting gas is carried from a cutting gas source (not illustrated). A metal tube 873, which is arranged along the optical axis 805 is connected, for fluid flow purposes, to the cutting gas supply line 872. The metal tube 873 opens into a housing 874, which is adjacent to the processing region 823. A capacitance measurement/control device 875 is electrically connected to the metal tube 873 and to the workpiece 801, and is in turn connected, for signaling purposes, to an adjustment apparatus 876, which is illustrated only schematically. This allows axial movement of the metal tube 873, thus adjusting the distance between the gas nozzle 874 and the workpiece 801.

Except for the region in the vicinity of the gas nozzle 874, the metal tube 873 is covered by a shielding electrode 877, which is in the form of a sleeve and coaxially surrounds the metal tube 873. Two high-voltage contacts, which are electrically connected to one another, of a high-voltage electrode 899 are located on opposite sides of the outer casing surface of the shielding electrode 877.

A laser diode 896 is provided in order to adjust the gas nozzle 874 such that the cutting gas jet that is supplied overlaps the working region 823 as efficiently as possible, and its radiation is coupled via a window into the metal tube 873 such that its emitted beam lies on the central axis of the metal tube 873. The emitted beam emerges through the gas nozzle 874 in the direction of the working region 823, and can thus be used for lateral adjustment of the point at which the cutting gas strikes the workpiece 801, relative to the processing region 823. For this adjustment process, the emission from a corresponding adjustment laser (not illustrated) can also be coupled into the beam path of the laser diode arrays 803, so that the radiation from this adjustment laser predetermines the focused working laser beam, and the radiation from this adjustment laser can be superimposed on the radiation from the laser diode 896.

The cutting gas supply apparatus 871 operates as follows:

In order to force out molten metal in the course of a welding process which is being carried out by the material processing apparatus, cutting gas is supplied through the supply line 872 and the metal tube 873, via the gas nozzle 874, to the processing region 823. The gas is in this case supplied at a sufficiently high pressure that the liquid metal is forced out of the processing region 823. The more exactly the gas nozzle 874 is located above the processing region 823, and the closer the gas nozzle 874 is to the workpiece 801, without in the process entering the beam path of the emitted beams 872, the more efficiently is the liquid metal forced out.

In order to optimize the working efficiency of the cutting gas supply apparatus 871, the lateral position of the gas nozzle 874 above the processing region 823 is first of all adjusted in advance using the radiation from the laser diode 896 while, secondly, the distance between the gas nozzle 874 and the workpiece 801 is controlled capacitively. The capacitance measurement/control device 875 in this case monitors the capacitance which is formed from the metal tube 872 and the workpiece 801. A specific capacitance in this case corresponds to a specific distance between the gas nozzle 874 and the workpiece 801. A predetermined nominal capacitance is maintained by the capacitance measurement/control device 874 by appropriate actuation of the adjustment apparatus 876, which varies the distance between the gas nozzle 874 and the workpiece 801.

In a further embodiment of the material processing apparatus, which is not illustrated, a barrier gas supply apparatus (see the supply apparatus 871 in FIG. 12) in the form of a tube is passed through the openings 821, 826 in the optical arrangement, and this tube surrounds an arcing metal electrode. A metal electrode such as this makes it possible to combine a laser welding process by means of the laser diode arrays 803 with an arc welding process to form a hybrid welding method. The metal electrode is in this case guided in the direction of the working region 823, for arc welding. It is at a high-voltage potential with respect to the workpiece 801 and, during the welding process, melts away at the end facing the workpiece 801.

The schematic block diagram in FIG. 13 shows a laser power control system 979, which can be used to control the radiation power levels of the lasers 903 within a laser group, or to control the radiation power levels of lasers associated with different laser groups, in each case jointly or to control the radiation power from different laser sources, for example from a laser group and from an additional laser, for a material processing apparatus. By way of example, the illustration shows the operation for two lasers 903, 903', which are respectively supplied with electrical power from associated drivers 980, 980'. The drivers 980, 980' are connected for signaling purposes to a power control unit 981. The latter controls the drivers 980, 980'.

The power control unit 981 can influence the power as a reaction to the transmission of signals from a sensor arrangement 953 monitoring the processing region, or in response to a direct user input, or in the course of a preprogrammed sequence.

The schematic block diagram in FIG. 14 shows a wavelength-selective material processing control circuit for use of a laser group 1004 and of an additional laser 1082. Light at the two corresponding wavelengths, which is reflected from a processing region 1023, is collimated by an optical device 1083, for example a lens or an objective. It then arrives at a dichroitic beam splitter 1084, which transmits and reflects the various wavelengths of the light originating from the processing region 1023. The component transmitted by the dichroitic beam splitter 1084 is detected by a detector 1085, while the reflected component is detected by a detector 1086.

A signal processing device 1087 forms the ratio of the two output signals from the detectors 1085, 1086. As a function of the result of this ratio formation process, the signal processing device 1087 passes on a signal to a power control unit 1081. The latter controls the drivers for the laser group 1004 and for the additional laser 1082, which are not shown in FIG. 15, as a function of the signal transmitted by the signal processing device 1087.

During material processing, in which the aim is to selectively remove a material layer from a workpiece, the material processing control system in FIG. 14 operates as follows:

As long as the processing region 1023 of the material processing apparatus is still located completely in the upper material layer which is to be removed, radiation originates from it at that wavelength which is characteristically reflected by the upper material layer. When, during the material removal process in the course of the material processing, the processing region 1023 starts to enter a lower material layer, which is not to be removed, and whose characteristics differ from those of the upper material layer, components at a wavelength which is characteristically reflected by the lower material layer are added to the radiation originating from the processing region 1023. In particular, the emitted radiation spectrum now starts to have wavelength components which are characteristic of the second material layer.

The dichroitic beam splitter 1084 is used to reflect onto the detector 1086 radiation with wavelength components which are characteristic of the lower material layer. In contrast, only radiation with wavelength components which do not originate from the lower material layer passes through the dichroitic beam splitter 1084 to the detector 1085. As the proportion of the radiation from the lower material layer increases, the signal from the detector 1086 increases, and the signal from the detector 1085 decreases.

The ratio of the signals from the detectors 1085 and 1086, which is formed by the signal processing device 1087, thus decreases as the processing region penetrates more deeply into the lower material layer. This penetration depth can thus be preset, in order to remove a material layer in a controlled manner, by presetting a suitable threshold value, with which the signal ratio that is formed is compared in the signal processing device 1087. To achieve this, the drivers for the laser group 1004 and for the additional laser 1082 are driven downwards, or the workpiece is moved on laterally with respect to the optical axis in the working plane 1013 by means of a feed device, depending on whether or not this threshold value has been reached.

The following procedure can also be used as an alternative to the use of a dichroitic beam splitter with two detectors:

The detection process is in this case carried out using a single detector, which receives pulses from the lasers. For example, one laser can be operated continuously (cw mode) while the other is pulsed (pulsed mode). Alternatively, both lasers may operate in the pulsed mode, with the pulses being emitted at different times. The detection by the detector is synchronized to the emission characteristics over time of the lasers. After sequential detection of the reflected pulses, the detected signals are stored, and are supplied to the signal processing device.

Figure 15:
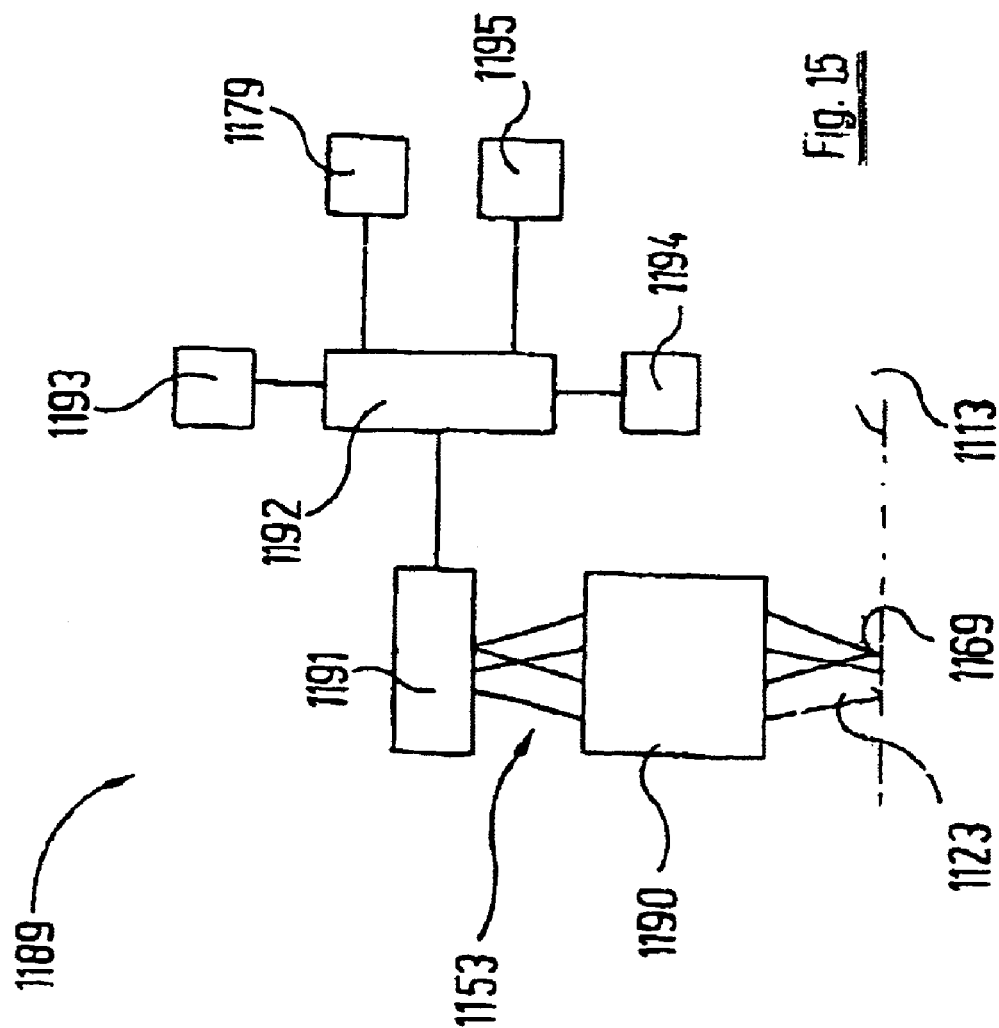
FIG. 15 shows a schematic block diagram of a position control circuit for the relative position of a working region of the apparatus with respect to a working focus of the apparatus.
Figure 16:
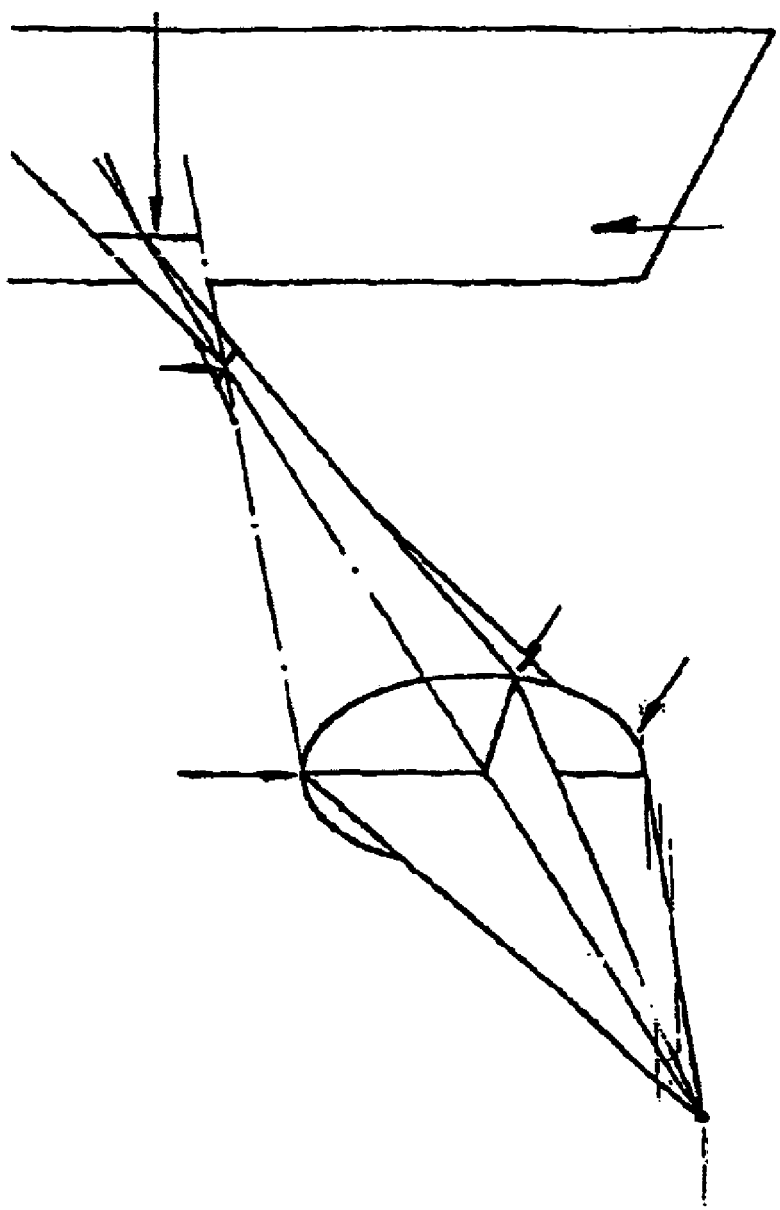
FIG. 16 shows an outline illustration of the imaging conditions when imaging an object using an astigmatic optical element.

In situations in which the different material layers react with re-emissions at a characteristic wavelength, it is also possible to operate with a single laser. The schematic block diagram in FIG. 15 shows a position control system 1189, which is part of a processing control system which can be used, for example, in conjunction with the material processing apparatus shown in FIG. 11. Imaging optics 1190 image radiation originating from the workpiece 1101 onto a position-sensitive detector 1191, for example a two-dimensional CCD array. FIG. 16 shows radiation which originates from a working region 1123, that is to say the region in which the radiation from one laser group acts on the workpiece 1101, and a working focus 1169, that is to say the region of the workpiece which is acted on by an additional laser.

The measured values from the position-sensitive detector 1191 are passed on to a monitoring device 1192, which uses this signal data to determine the coordinates of the working region 1123 and of the working focus 1169, and compares them with nominal coordinates. The nominal coordinates are either in the form of predetermined coordinates in a program controller 1193 which is connected for signaling purposes to the monitoring device 1192, or are obtained during material processing from coordinates of the workpiece, which are transmitted by an additional sensor 1194, which is likewise connected for signaling purposes to the monitoring device 1192. The sensor 1194 may, for example, be a camera which covers the current material processing region of the workpiece and its environment.

The coordinates measured by the position-sensitive detector 1191 and the nominal coordinates are used by the monitoring device 1192 to calculate control signals for a power control apparatus 1179 (comparable to the power control device 979 in FIG. 13), and are used by an adjustment device 1194 to adjust the relative position between the working region 1123 and the working focus 1169, for example by adjusting adjustment optics (comparable to the adjustment optics 763 in FIG. 11).

Such a position control system 1189 makes it possible, for example during a laser welding process using two focal points for welding two-dimensional contours, to orient the position of the working focus 1169, which is in front of or behind the working region 1122, as required about the optical axis of the optical arrangement. In addition, the position control system 1189 may include a known seam following device.

In the description above, in conjunction with FIGS. 1 to 4, of the imaging characteristics of the astigmatic optical element 7; 107; 207 it has been assumed that the image sizes of the axes of the emission areas are of equal size. However, this is not a necessary precondition for achieving a focused working laser beam with a cross-sectional area with axes of essentially the same length in a compensating plane, as is described in the following text:

As shown in the outline illustration in FIG. 5, the imaging planes in the main planes of an astigmatically imaging optical element (the main planes are identical to the meridional and the sagittal planes for an object that is to be imaged and is at a distance from the optical axis) for the imaging of an object which is represented schematically in the form of a point in FIG. 5 generally differ from one another, so that the two axes of an object are imaged sharply in different imaging planes.

Between these two imaging planes, that is to say in the region in which the beams of the image which is first of all imaged behind the astigmatic element diverge from one another again in the first main plane, while the beam still runs in a convergent manner in the second main plane that is at right angles to the first main plane, the transverse extents of the beams associated with the main planes approach one another in two mutually perpendicular directions. In particular, in this case as well, it is possible to specify a compensating plane between the two imaging planes, for which the transverse extents of the beams are essentially the same, irrespective of the size of the images being imaged on the two main planes.

What we claim is:

1. An apparatus having at least one light source which has or have a number of individual light sources, and having an optical arrangement, which, by superimposition, produces a focused working beam with a high area coverage from the emitted beams from the individual light sources, with at least two individual light sources having an emission area with axes which are of different length and are at right angles to one another, wherein
   a) at least two individual light sources form at least one individual light source group which is arranged coaxially with respect to the optical axis of an astigmatic optical element to which the emitted beams from the individual light sources are applied, with
   b) in each case one axis of the emission area of an individual light source being located on a meridional plane, which is defined by the center point of the emission area of the astigmatic optical element, and the other axis of the emission area being located on the corresponding sagittal plane of the astigmatic optical element,
   c) and in that the astigmatic optical element has different imaging characteristics in the meridional and sagittal planes which are associated with the emission areas of the respective individual light sources, such that each emitted beam from the individual light sources has a cross-sectional area with axes of essentially the same length in the beam path downstream from the astigmatic optical element in at least one compensating plane which is at right angles to the optical axis of the astigmatic optical element, and
   d) all the emitted beams are guided by beam-guiding components in a working plane which is formed either by the compensating plane or by an imaging plane which is common to all the focused beams.

2. The apparatus as claimed in claim 1, wherein the individual light source group has individual light sources which have a number of individual emitters which are arranged, in particular, in a row alongside one another and emit individual emitted beams.

3. The apparatus as claimed in claim 1, wherein at least one individual light source is a laser.

4. The apparatus as claimed in claim 3, wherein at least some of the individual emitters are laser diodes.

5. The apparatus as claimed in claim 2, wherein at least one individual emitter is formed by the output fiber ends of a fiber bundle with a rectangular emission area, which is optically coupled to an emitted beam from a light source.

6. The apparatus as claimed in claim 3, wherein at least one laser is a solid-state laser.

7. The apparatus as claimed in claim 1, wherein the emission areas of the individual light sources form a polygon, whose center axis coincides with the optical axis of the astigmatic optical element.

8. The apparatus as claimed in claim 1, wherein the emitted beam powers from the individual light sources within an individual light source group and/or the individual light sources which are associated with different individual light source groups, can in each case be controlled jointly, and/or different light sources can be controlled individually, by a power control device.

9. The apparatus as claimed in claim 1, wherein at least two individual light sources have different emission wavelengths.

10. The apparatus as claimed in claim 1, wherein an imaging surface of the astigmatic optical element is an annular surface which is concave when seen from the outside.

11. The apparatus as claimed in claim 1, wherein the imaging surface of the astigmatic optical element is formed by facets which are fitted to it with multiple symmetry, coaxially with respect to the optical axis.

12. The apparatus as claimed in claim 1, wherein a central space, which is free of emitted beams, is bounded by the emitted beams, which are to be superimposed, from the individual light sources in the individual light source group, in which space a reflector is arranged, which intrinsically reflects back radiation which is reflected or re-emitted from a processing region, which is located in the working plane of a workpiece.

13. The apparatus as claimed in claim 12, wherein at least one of the beam-guiding optical components a central opening.

14. The apparatus as claimed in claim 13, wherein the reflector is arranged in the opening.

15. The apparatus as claimed in claim 1, wherein the beam-guiding optical components are arranged such that the optical arrangement in the region about their optical axis has a continuous free space, in which no radiation from the individual light source group is carried.

16. The apparatus as claimed in claim 12, further comprising a sensor arrangement for recording the processing region.

17. The apparatus as claimed in claim 16, wherein the sensor arrangement is arranged in the free space.

18. The apparatus as claimed in claim 16, wherein the sensor arrangement is part of the power control device.

19. The apparatus as claimed in claim 16, wherein the sensor arrangement has an optical sensor.

20. The apparatus as claimed in claim 16, wherein the sensor arrangement has a wavelength-selective filter.

21. The apparatus as claimed in claim 20, wherein at least two individual light sources have different emission wavelengths, and the wavelength-selective filter separates these different emission wavelengths.

22. The apparatus as claimed in claim 19, wherein the sensor is a position-sensitive optical sensor, and the sensor arrangement also has imaging optics for imaging the processing region onto the sensor.

23. The apparatus as claimed in claim 22, wherein the position-sensitive optical sensor is a multiple detector sensor.

24. The apparatus as claimed in claim 23, wherein the position-sensitive sensor is a quadrant detector.

25. The apparatus as claimed in claim 23, wherein the position-sensitive sensor is a CCD detector.

26. The apparatus as claimed in claim 23, wherein the position-sensitive sensor is a CMOS camera.

27. The apparatus as claimed in claim 16, wherein an acoustic wave sensor is part of the sensor arrangement.

28. The apparatus as claimed in claim 16, wherein the sensor arrangement is connected for signaling purposes to an electronic evaluation device for determining the relative position between the working plane and the workpiece.

29. The apparatus as claimed in claim 1, further comprising a compensating device for compensating for mechanically or thermally induced deformation of individual light sources in the individual light source group or of beam-guiding components or of holding bodies or heat sinks of them with actuators for controlled deformation or for positioning of regions of the individual light sources in the individual light source group or of beam-guiding components, or of holding bodies or heat sinks of them.

30. The apparatus as claimed in claim 29, wherein the actuators are connected for signaling purposes via a control device to a detection device which has a sensor for recording the deformation.

31. The apparatus as claimed in claim 30, wherein the sensor of the sensor arrangement is used as a sensor of the detection device.

32. The apparatus as claimed in claim 31, wherein the sensor of the detection device is a position sensor for direct determination of the deformation.

33. The apparatus as claimed in claim 29, wherein the actuators have a number of pressure chambers which are connected to a fluid reservoir via fluid channels, with the control device being used for individual control of the respective fluid pressure in the pressure chamber.

34. The apparatus as claimed in claim 33, wherein each pressure chamber has an associated closed fluid circuit, which has an inlet flow line from and an outlet flow line to a fluid reservoir and in which a control valve is arranged, which interacts with the control device.

35. The apparatus as claimed in claim 34, wherein the fluid circuit is part of a cooling device for the optical arrangement.

36. The apparatus as claimed in claim 35, wherein the cooling device has heat sinks composed of highly thermally conductive material, in which the cooling fluid circulates and which are thermally coupled to the individual light source or to the beam-guiding components.

37. The apparatus as claimed in claim 36, wherein the individual light sources in the individual light source group or the beam-guiding components are coupled via the heat sinks to holding devices composed of a material having a low thermal coefficient of expansion.

38. The apparatus as claimed in claim 36, wherein the heat sinks and/or the holding device are composed of ceramic.

39. The apparatus as claimed in claim 33, further comprising a monitoring device for state parameters of the pressure and/or cooling fluid.

40. The apparatus as claimed in claim 29, wherein the actuators are formed by piezoelectric elements.

41. The apparatus as claimed in claim 17, wherein an additional optical arrangement is arranged in the continuous free space for focusing of an emitted beam from an additional light source which is not part of an individual light source group, with the working focus of the additional light source being located on the working plane of the individual light source group.

42. The apparatus as claimed in claim 41, wherein adjustment optics for adjusting the position and/or the size of the working focus of the additional light source are part of the additional optical arrangement.

43. The apparatus as claimed in claim 42, wherein the adjustment optics are formed by at least one lens or one objective and are arranged in a housing which can be adjusted via an adjustment device relative to the optical axis and relative to the processing region.

44. The apparatus as claimed in claim 43, wherein the longitudinal axis of the housing, which coincides with the optical axis of the adjustment optics, is inclined with respect to the optical axis of those components of the optical arrangement which carry the emitted beams from the individual light sources in the individual light source group, with the adjustment device having a rotary drive for rotating the adjustment optics about the optical axis of the components of the optical arrangement.

45. The apparatus as claimed claim 43, wherein the adjustment device is connected for signaling purposes to a positioning controller for positioning the working focus with respect to the processing region.

46. The apparatus as claimed in claim 45, wherein the positioning controller is connected for signaling purposes to a monitoring device for determining position and/or processing parameters of the workpiece.

47. The apparatus as claimed claim 45, wherein the positioning controller is connected for signaling purposes to the power control device.

48. The apparatus as claimed in claim 41, wherein the additional light source is a solid state laser.

49. The apparatus as claimed in claim 41, wherein the additional light source is guided with respect to the adjustment optics via a beam guidance system.

50. The apparatus as claimed in claim 15, wherein a welding arrangement for arc welding is at least partially arranged in the continuous free space, with a welding working region of the welding arrangement being located on the working plane of the individual light source group.

51. The apparatus as claimed in claim 15, further comprising a fluid feed apparatus which is connected to a fluid reservoir and has a feed device which is at least partially arranged in the free space, with a free aperture, and has a feed end for fluid, by means of which fluid can be applied to the processing region and/or fluid can be sucked out of the processing region.

52. The apparatus as claimed in claim 51, wherein the feed device has a feed tube in which the fluid is guided at least in places within the continuous free aperture region, and whose feed end is adjacent to the processing region.

53. The apparatus as claimed in claim 51, wherein the feed end is in the form of a nozzle.

54. The apparatus as claimed in claim 51, wherein the feed end is interchangeable or replaceable.

55. The apparatus as claimed in claim 51, further comprising a distance measurement device for determining the distance between the feed end and the workpiece.

56. The apparatus as claimed in claim 55, wherein at least the feed end is composed of electrically conductive material and has a holder which electrically isolates the feed end from the workpiece, with the distance measurement device being a capacitance measurement arrangement for determining the capacitance between the feed end and the workpiece.

57. The apparatus as claimed in claim 56, wherein the feed tube is composed of electrically conductive material and is surrounded, at least in places, by a shielding electrode.

58. The apparatus as claimed in claim 57, further comprising a device for producing an axial relative movement between the feed tube and the shielding electrode.

59. The apparatus as claimed in claim 57, wherein the shielding electrode is in the form of a shielding tube which is coaxial with respect to the feed tube.

60. The apparatus as claimed in claim 51, further comprising a positioning device for producing a relative movement between the feed end and the workpiece.

61. The apparatus as claimed in claim 60, wherein the positioning device has an adjusting device for fine positioning of the feed end with respect to the workpiece.

62. The apparatus as claimed in claim 61, wherein the adjusting device has an adjusting light source which is fitted to the feed device and whose radiation is guided such that it is collimated at least by the feed end of the feed device.

63. The apparatus as claimed in claim 62, wherein the light source is a laser diode which operates in the visible wavelength band.

64. The apparatus as claimed in claim 61, wherein the fluid is a gas which is supplied to the processing region at high pressure.

65. The apparatus as claimed in claim 1, wherein a number of individual light source groups are provided, and are arranged coaxially with respect to the optical axis.

* * * * *